(12) United States Patent
Cheng et al.

(10) Patent No.: US 11,239,138 B2
(45) Date of Patent: Feb. 1, 2022

(54) METHODS OF PACKAGING SEMICONDUCTOR DEVICES AND PACKAGED SEMICONDUCTOR DEVICES

(71) Applicant: Taiwan Semiconductor Manufacturing Company, Ltd., Hsin-Chu (TW)

(72) Inventors: Li-Hui Cheng, New Taipei (TW); Po-Hao Tsai, Zhongli (TW); Jing-Cheng Lin, Chu Tung Zhen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 171 days.

(21) Appl. No.: 14/318,180

(22) Filed: Jun. 27, 2014

(65) Prior Publication Data

US 2015/0380340 A1 Dec. 31, 2015

(51) Int. Cl.
*H01L 23/48* (2006.01)
*H01L 25/00* (2006.01)
(Continued)

(52) U.S. Cl.
CPC ...... *H01L 23/481* (2013.01); *H01L 21/31053* (2013.01); *H01L 21/565* (2013.01);
(Continued)

(58) Field of Classification Search
CPC ............... H01L 21/486; H01L 21/6835; H01L 21/76898; H01L 21/6836; H01L 23/13; H01L 23/147; H01L 23/3121; H01L 23/49827; H01L 23/481; H01L 23/49822; H01L 25/0652; H01L 25/0655; H01L 25/0657; H01L 25/50; H01L 24/13; H01L 24/16; H01L 24/73; H01L 24/81; H01L 23/3107; H01L 23/528; H01L 23/5329; H01L 21/561; H01L 21/565;
(Continued)

(56) References Cited

U.S. PATENT DOCUMENTS 6,184,061 B1 * 2/2001 Wu .................... H01L 21/4853
438/106
7,902,643 B2 * 3/2011 Tuttle ................ H01L 21/76898
257/659

(Continued)

FOREIGN PATENT DOCUMENTS

CN 101944519 A 1/2011
KR 20090000573 A 1/2009
(Continued)

*Primary Examiner* — Dale E Page
*Assistant Examiner* — Quovaunda V Jefferson
(74) *Attorney, Agent, or Firm* — Slater Matsil, LLP

(57) ABSTRACT

Methods of packaging semiconductor devices and packaged semiconductor devices are disclosed. In some embodiments, a method of packaging a semiconductor device includes coupling through-vias to an insulating material, each of the through-vias having a first width. Dies are also coupled to the insulating material. A portion of the insulating material is removed proximate each of the through-vias. The portion of the insulating material proximate each of the through-vias removed has a second width, the second width being less than the first width.

24 Claims, 23 Drawing Sheets

(51) Int. Cl.
*H01L 21/56* (2006.01)
*H01L 21/768* (2006.01)
*H01L 21/683* (2006.01)
*H01L 21/3105* (2006.01)
*H01L 21/78* (2006.01)
*H01L 23/538* (2006.01)
*H01L 23/00* (2006.01)
*H01L 23/498* (2006.01)
*H05K 1/18* (2006.01)
*H01L 21/48* (2006.01)
*H01L 23/31* (2006.01)

(52) U.S. Cl.
CPC ...... *H01L 21/6835* (2013.01); *H01L 21/6836* (2013.01); *H01L 21/768* (2013.01); *H01L 21/78* (2013.01); *H01L 23/49811* (2013.01); *H01L 23/5389* (2013.01); *H01L 24/19* (2013.01); *H01L 24/97* (2013.01); *H01L 25/50* (2013.01); *H05K 1/18* (2013.01); *H01L 21/486* (2013.01); *H01L 21/4857* (2013.01); *H01L 21/561* (2013.01); *H01L 21/568* (2013.01); *H01L 23/3128* (2013.01); *H01L 24/32* (2013.01); *H01L 24/48* (2013.01); *H01L 24/73* (2013.01); *H01L 24/83* (2013.01); *H01L 24/92* (2013.01); *H01L 2221/68327* (2013.01); *H01L 2221/68372* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/83005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/00014* (2013.01); *H01L 2924/14* (2013.01); *H01L 2924/1431* (2013.01); *H01L 2924/1434* (2013.01); *H01L 2924/1436* (2013.01); *H01L 2924/15311* (2013.01); *H01L 2924/181* (2013.01)

(58) Field of Classification Search
CPC . H01L 21/768; H01L 21/31053; H01L 21/78; H01L 24/11; H01L 24/96
See application file for complete search history.

(56) References Cited

U.S. PATENT DOCUMENTS

| | | | |
|---|---|---|---|
| 2003/0013233 A1* | 1/2003 | Shibata | H01L 24/27 438/114 |
| 2003/0080431 A1* | 5/2003 | Uzoh | H01L 21/7684 257/758 |
| 2003/0164540 A1* | 9/2003 | Lee | H01L 21/486 257/686 |
| 2004/0070064 A1* | 4/2004 | Yamane | H01L 23/3114 257/686 |
| 2005/0001329 A1* | 1/2005 | Matsuki | H01L 23/3114 257/777 |
| 2008/0316714 A1 | 12/2008 | Eichelberger et al. | |
| 2009/0008762 A1 | 1/2009 | Jung | |
| 2009/0152715 A1* | 6/2009 | Shim | H01L 21/568 257/737 |
| 2010/0103634 A1* | 4/2010 | Funaya | H01L 23/5389 361/761 |
| 2010/0108130 A1* | 5/2010 | Ravi | H01L 31/061 136/255 |
| 2010/0193928 A1 | 8/2010 | Zudock et al. | |
| 2010/0237495 A1* | 9/2010 | Pagaila | H01L 21/568 257/700 |
| 2011/0001245 A1 | 1/2011 | Jobetto | |
| 2011/0254160 A1* | 10/2011 | Tsai | H01L 21/486 257/738 |
| 2012/0049364 A1* | 3/2012 | Sutardja | H01L 24/24 257/738 |
| 2012/0273960 A1 | 11/2012 | Park et al. | |
| 2014/0131858 A1 | 5/2014 | Pan et al. | |
| 2014/0168014 A1* | 6/2014 | Chih | H01L 24/19 343/700 MS |
| 2015/0187742 A1 | 7/2015 | Kwon et al. | |

FOREIGN PATENT DOCUMENTS

| | | |
|---|---|---|
| KR | 20130132162 A | 12/2013 |
| KR | 20140061959 A | 5/2014 |
| WO | WO 2013062593 * | 5/2013 |

* cited by examiner

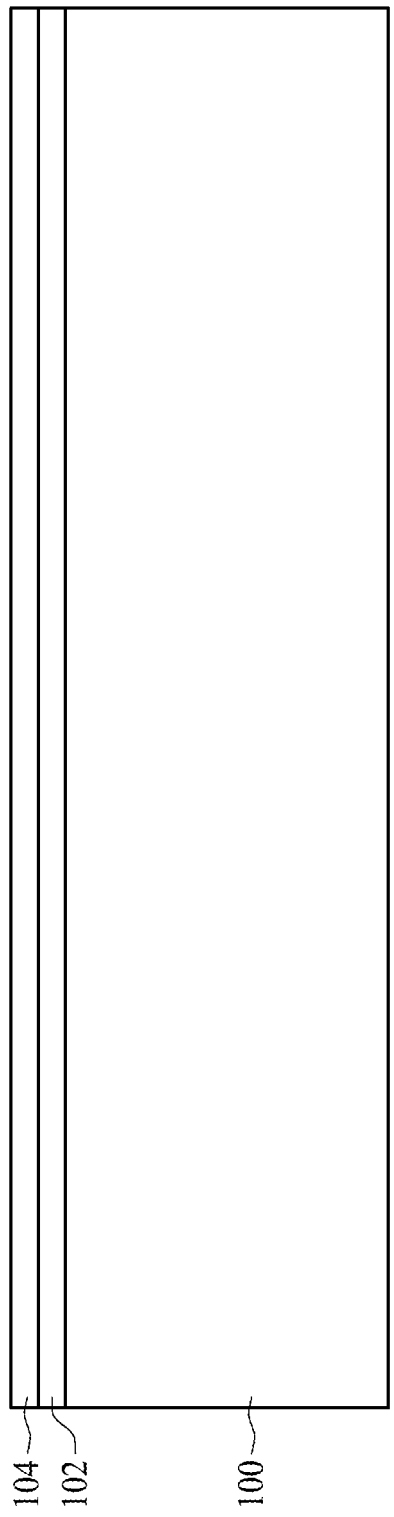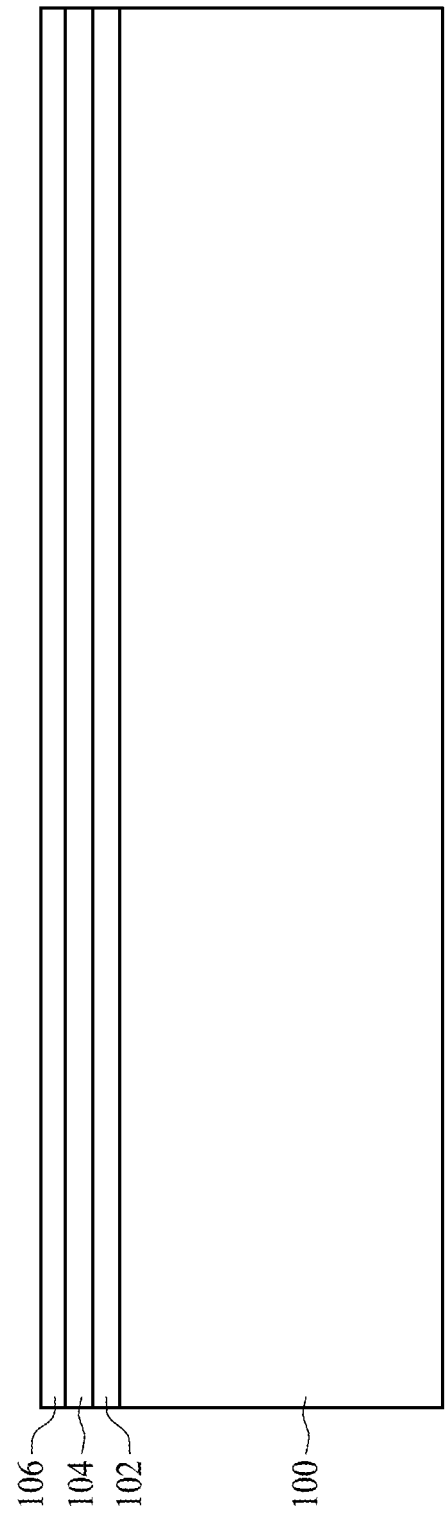

METHODS OF PACKAGING SEMICONDUCTOR DEVICES AND PACKAGED SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 16 are cross-sectional views illustrating a method of packaging a semiconductor device at various stages in accordance with some embodiments of the present disclosure.

DETAILED DESCRIPTION

Figure 3:
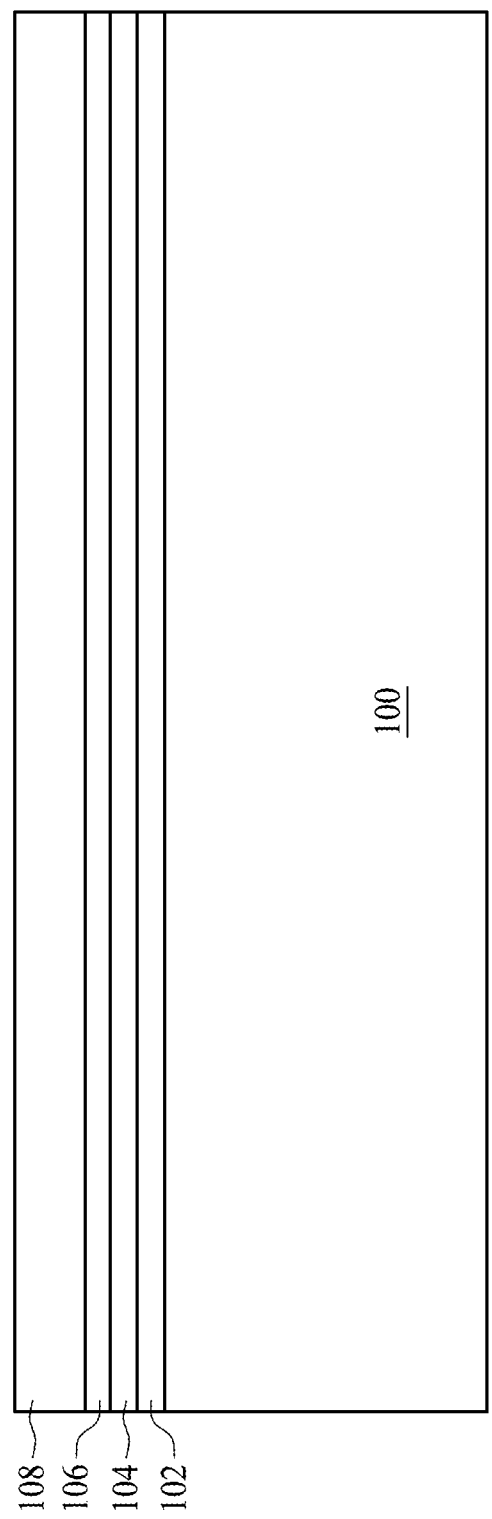

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel methods of packaging semiconductor devices and structures thereof, wherein openings in an insulating material layer have a smaller width than a width of through-vias of the package. The openings with reduced width improve reliability of the package, eliminate recesses and drilling gaps in adjacent molding material layers, and prevent water vapor penetration, to be described further herein.

FIGS. 1 through 16 are cross-sectional views illustrating a method of packaging a semiconductor device at various stages in accordance with some embodiments of the present disclosure. Referring first to FIG. 1, to package the semiconductor device, a carrier 100 is provided. The carrier 100 may comprise glass, silicon oxide, aluminum oxide, or a semiconductor wafer, as examples. The carrier 100 may also comprise other materials. The carrier may be circular, square, or rectangular in a top view, as examples. Alternatively, the carrier 100 may comprise other shapes.

The carrier 100 has a film 102 formed thereon in some embodiments. The film 102 comprises a light to heat conversion (LTHC) material or other materials, for example. The LTHC film 102 comprises a thickness of about 0.5 μm to about 3 μm, for example. Alternatively, the film 102 may comprise other dimensions. In some embodiments, the film 102 is not included.

To package a semiconductor device, an insulating material 104 is disposed over the film 102, as shown in FIG. 1. The insulating material 104 is formed over the carrier 100 in embodiments wherein the film 102 is not included. The insulating material 104 comprises a passivation layer for the package. The insulating material 104 comprises a glue/polymer base buffer layer in some embodiments, for example. The insulating material 104 comprises a solder resist (SR), polyimide (PI), polybenzoxazole (PBO), or multiple layers or combinations thereof in some embodiments, as examples. The insulating material 104 comprises a thickness of about 1 μm to about 20 μm, for example. Alternatively, the insulating material 104 may comprise other materials and dimensions. The insulating material 104 is formed using spin coating, lamination, or other methods, for example.

Next, a seed layer 106 is formed over the insulating material 104, as shown in FIG. 2. The seed layer 106 comprises a seed material for a subsequent plating process for through-vias, to be described further herein. The seed layer 106 comprises a metal, such as copper, a titanium and copper alloy, other metals, alloys, combinations or multiple layers thereof, as examples. The seed layer 106 comprises a thickness of about 500 Angstroms to about 5,000 Angstroms, for example. Alternatively, the seed layer 106 may comprise other materials and dimensions. The seed layer 106 is formed by physical vapor deposition (PVD) or other methods.

Figure 4:
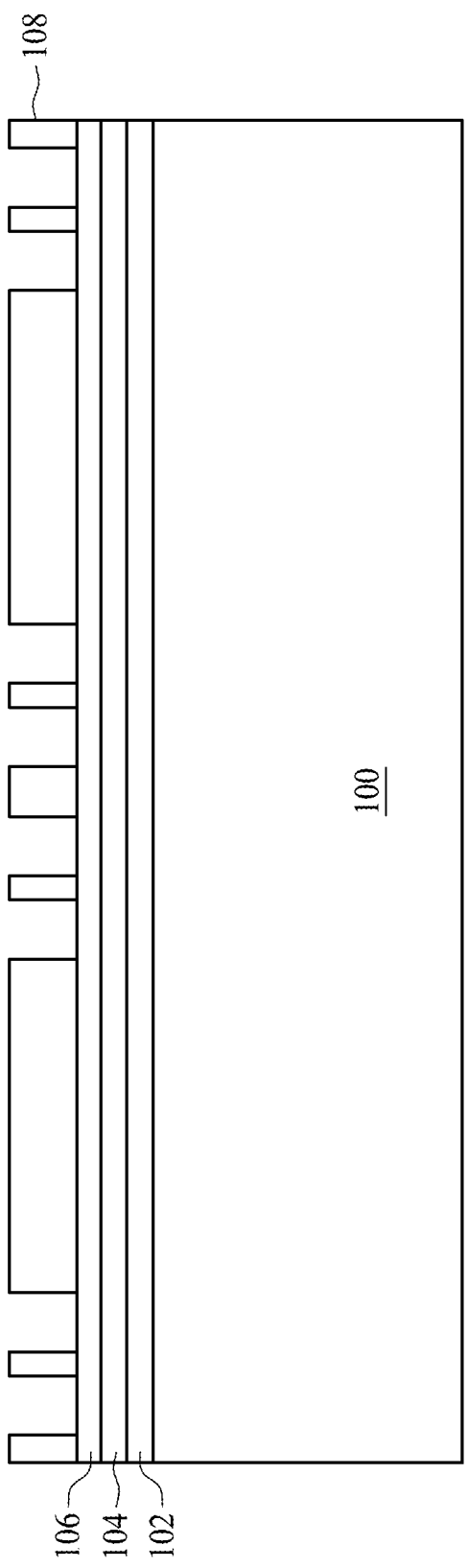

A sacrificial material 108 is then formed over the seed layer 106, as shown in FIG. 3. The sacrificial material 108 comprises a photoresist, an organic material, an insulating material, or other materials, in some embodiments, as examples. The sacrificial material 108 is patterned with a desired pattern for a plurality of through-vias using a lithography process or a direct patterning process, as shown in FIG. 4. In a lithography process, the sacrificial material 108 comprising a photoresist or other material is exposed to light or energy reflected from or transmitted through a lithography mask (not shown) that has the desired pattern thereon. The sacrificial material 108 is then developed, and portions of the sacrificial material 108 are then ashed or etched away. A direct patterning process may comprise forming the pattern in the sacrificial material 108 using a laser, for example. Alternatively, the sacrificial material 108 may be patterned using other methods.

Figure 5:
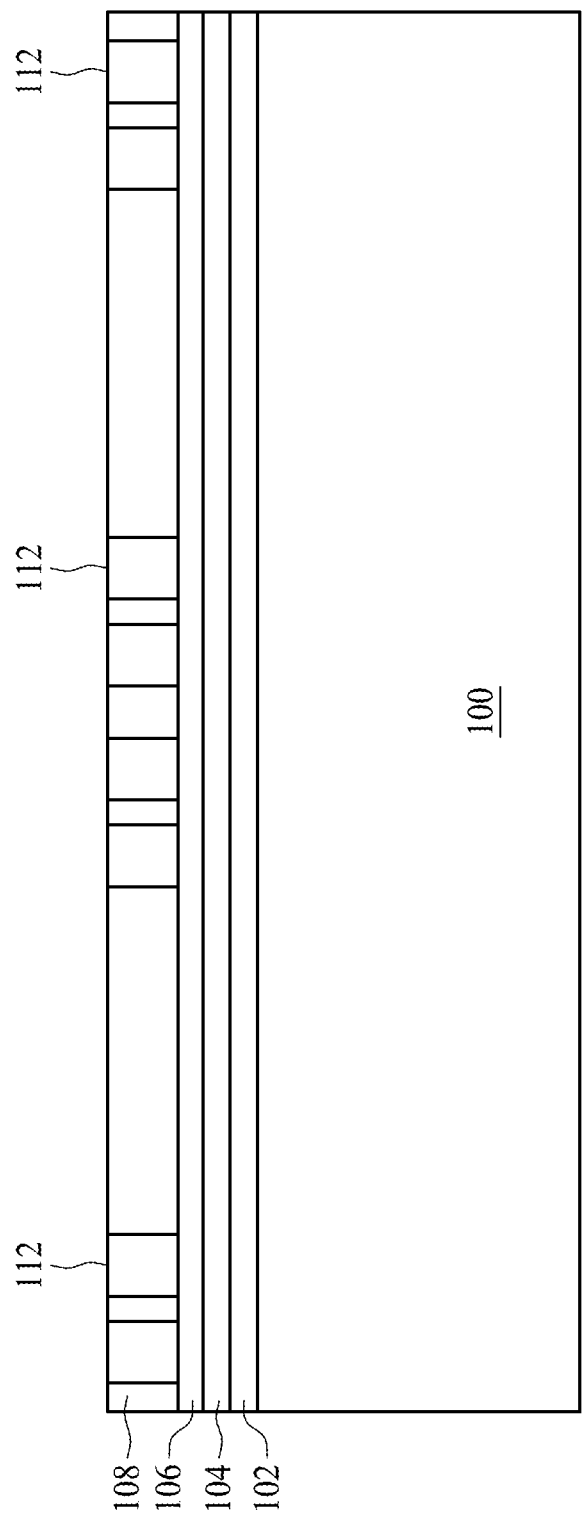

A plating process is used to form a conductive material 112 in the patterns of the sacrificial material 108 over the seed layer 106, as shown in FIG. 5. The plating process may comprise an electro-chemical plating (ECP) or other types of plating processes, for example. The seed layer 106 functions as a seed for the plating process for the conductive material 112. The conductive material 112 is plated over the seed layer 106 through the patterned sacrificial material 108.

Figure 6:
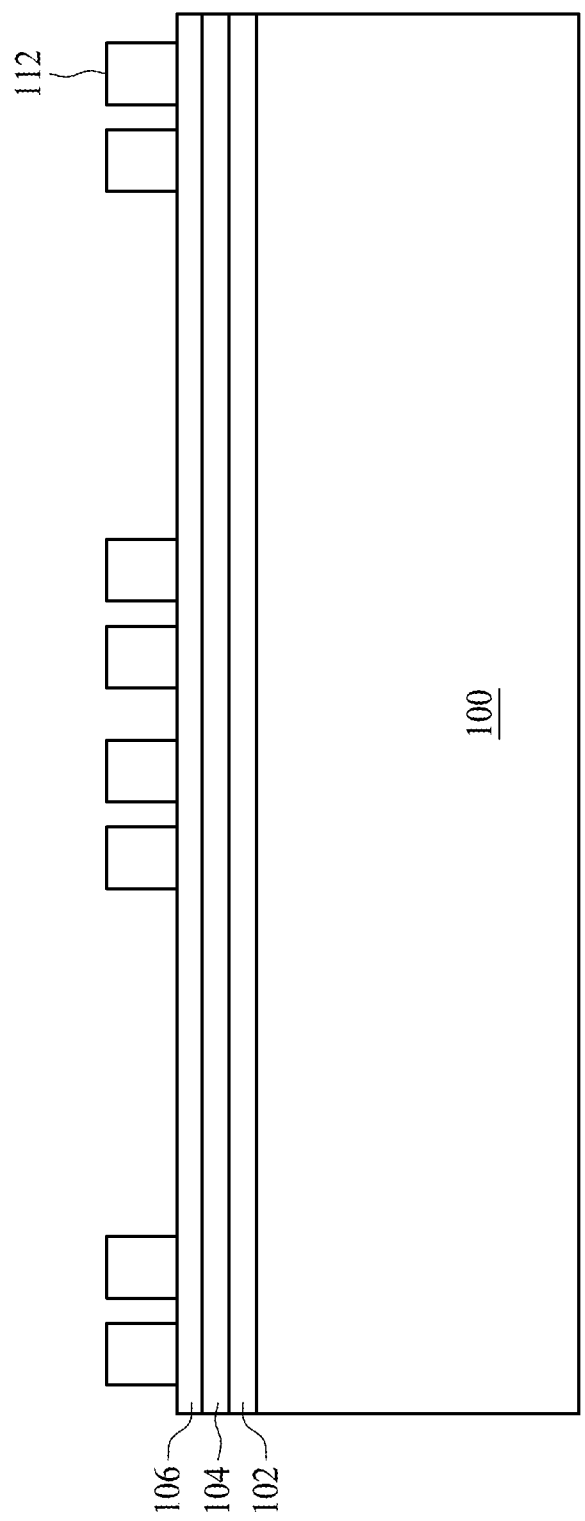

The sacrificial material 108 is then stripped or removed, as shown in FIG. 6. After the sacrificial material 108 is removed, portions of the seed layer 106 are left remaining over the insulating material 104 between the conductive material 112 that has been plated onto the seed layer 106.

Figure 7:
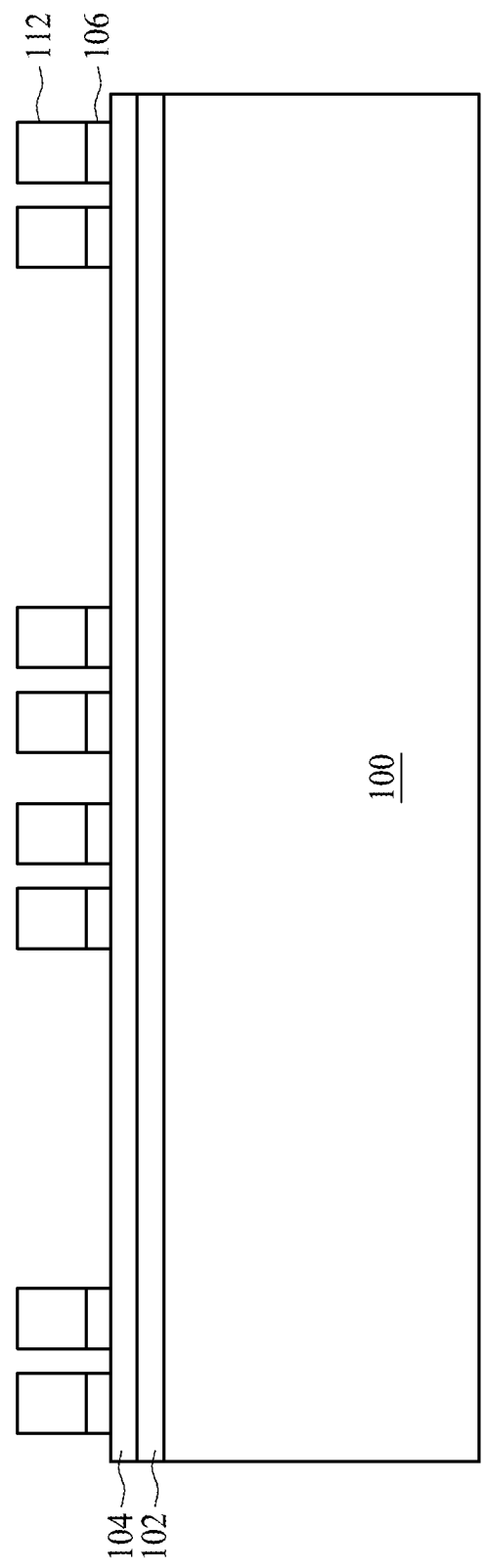

The exposed portions of the seed layer 106 are then removed, as shown in FIG. 7. An etch process or other process is used to remove the exposed portions of the seed layer 106 between the regions of conductive material 112, for example. The seed layer 106 and the conductive material 112 comprise through-vias 106/112 of a package for a semiconductor device. The through-vias 106/112 each comprise a lower portion comprising the material of the seed layer 106 and an upper portion comprising the plated-on conductive material 112.

In other embodiments, the through-vias 106/112 may be formed using subtractive techniques, damascene techniques, or other methods. For example, in a subtractive technique, a conductive material such as Cu, a Cu alloy, other metals, or combinations or multiple layers thereof may be formed over the entire surface of the insulating material 104, and the conductive material is patterned to form the through-vias 106/112. The through-vias 106/112 may comprise a single material layer in these embodiments, for example, not shown. The conductive material may be patterned using photolithography, by forming a layer of photoresist over the conductive material, exposing the layer of photoresist to light or energy reflected from or transmitted through a lithography mask having a desired pattern thereon, and developing the layer of photoresist. Exposed (or unexposed, depending on whether the layer of photoresist is positive or negative) portions of the layer of photoresist are then ashed and removed. The patterned layer of photoresist is then used as an etch mask during an etch process for the conductive material. The layer of photoresist is removed, leaving the conductive material patterned with the desired pattern of the through-vias 106/112.

A first side of the through-vias 106/112 is coupled to the insulating material 104 in some embodiments, for example.

Figure 8:
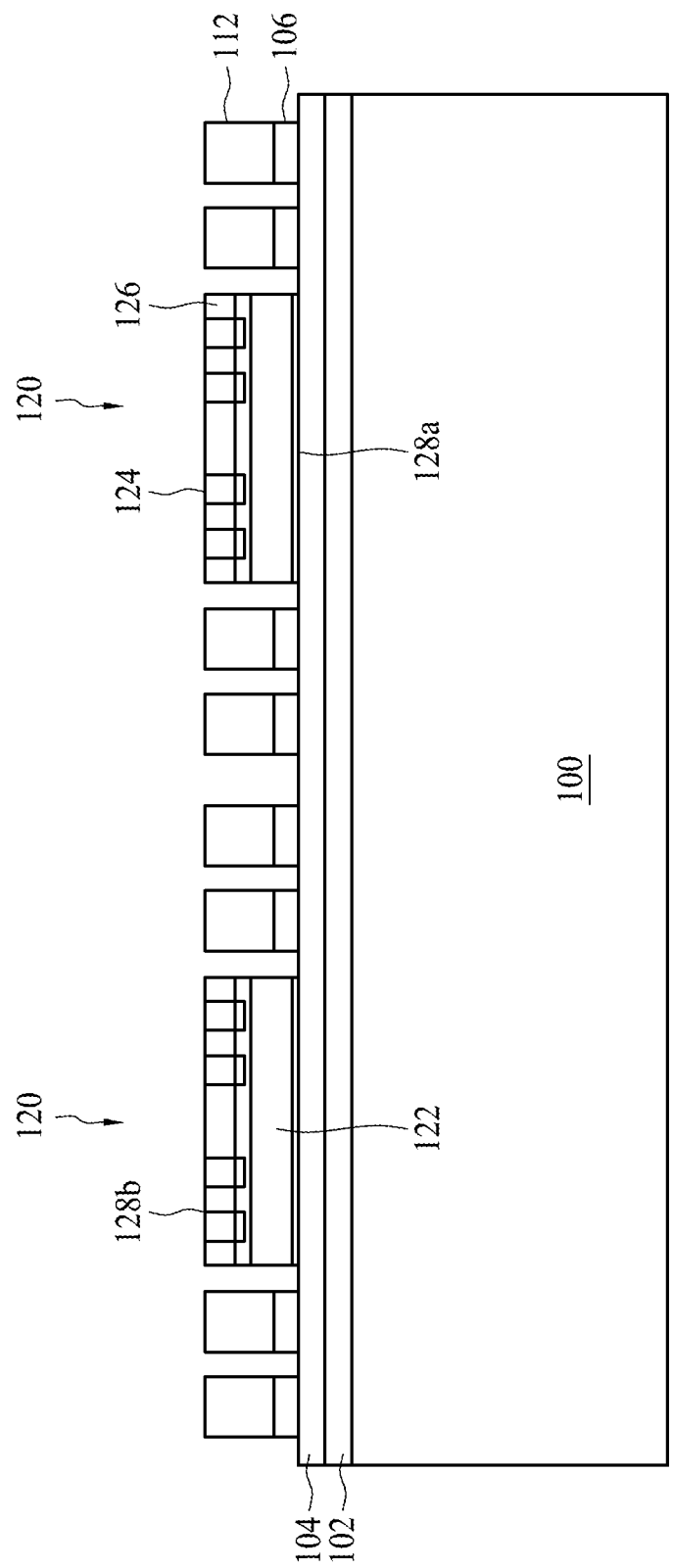

Referring next to FIG. 8, after the formation of the through-vias 106/112, a plurality of integrated circuit dies 120 are provided and are bonded to the insulating material 104. The integrated circuit dies 120 are also referred to herein, e.g., in some of the claims, as dies 120. The integrated circuit dies 120 comprise semiconductor devices that will be packaged in accordance with some embodiments of the present disclosure. The integrated circuit dies 120 may be previously fabricated on one or more semiconductor wafers, and the wafer or wafers are singulated or diced to form a plurality of the integrated circuit dies 120, for example.

The integrated circuit dies 120 include a substrate 122 comprising a semiconductive material and that includes circuitry, components, wiring, and other elements (not shown) fabricated within and/or thereon. The integrated circuit dies 120 are adapted to perform a predetermined function or functions, such as logic, memory, processing, other functions, or combinations thereof, as example. The integrated circuit dies 120 are typically square or rectangular in shape in a top view, not shown. The integrated circuit dies 120 each include a first side 128a and a second side 128b, the second side 128b being opposite the first side 128a. The first sides 128a of the integrated circuit dies 120 are coupled to the insulating material 104.

The integrated circuit dies 120 each include a plurality of contact pads 124 formed across the second side 128b thereof. The contact pads 124 are electrically coupled to portions of the substrate 122. The contact pads 124 comprise a conductive material such as copper, aluminum, other metals, or alloys or multiple layers thereof, as examples. Alternatively, the contact pads 124 may comprise other materials.

The contact pads 124 are disposed within an insulating material 126 formed over the substrate 122. Portions of the top surfaces of the contact pads 124 are exposed within the insulating material 126 so that electrical connections can be made to the contact pads 124. The insulating material 126 may comprise one or more insulating material layers, such as silicon dioxide, silicon nitride, a polymer material, or other materials. The insulating material 126 comprises a passivation layer in some embodiments, for example.

A plurality of the integrated circuit dies 120 are coupled to the carrier 100 over the insulating material 104. Only two integrated circuit dies 120 are shown in FIGS. 8 through 16; however, dozens, hundreds, or more integrated circuit dies 120 may be coupled to the carrier 100 and packaged simultaneously. The first sides 128a of the integrated circuit dies 120 are coupled to the carrier 100, over the insulating material 104. The integrated circuit dies 120 may be coupled to the insulating material 104 using an adhesive such as a die attach film (DAF), for example. The integrated circuit dies 120 may be coupled to the insulating material 104 manually or using an automated machine such as a pick-and-place machine.

In some embodiments, the integrated circuit dies 120 are coupled to the insulating material 104 disposed on the carrier 100, and the integrated circuit dies 120 are packaged in individual packages. In other embodiments, two or more integrated circuit dies 120 can be packaged together. A plurality of integrated circuit dies 120 comprising the same or different functions may be packaged together in accordance with some embodiments, for example.

Figure 9:
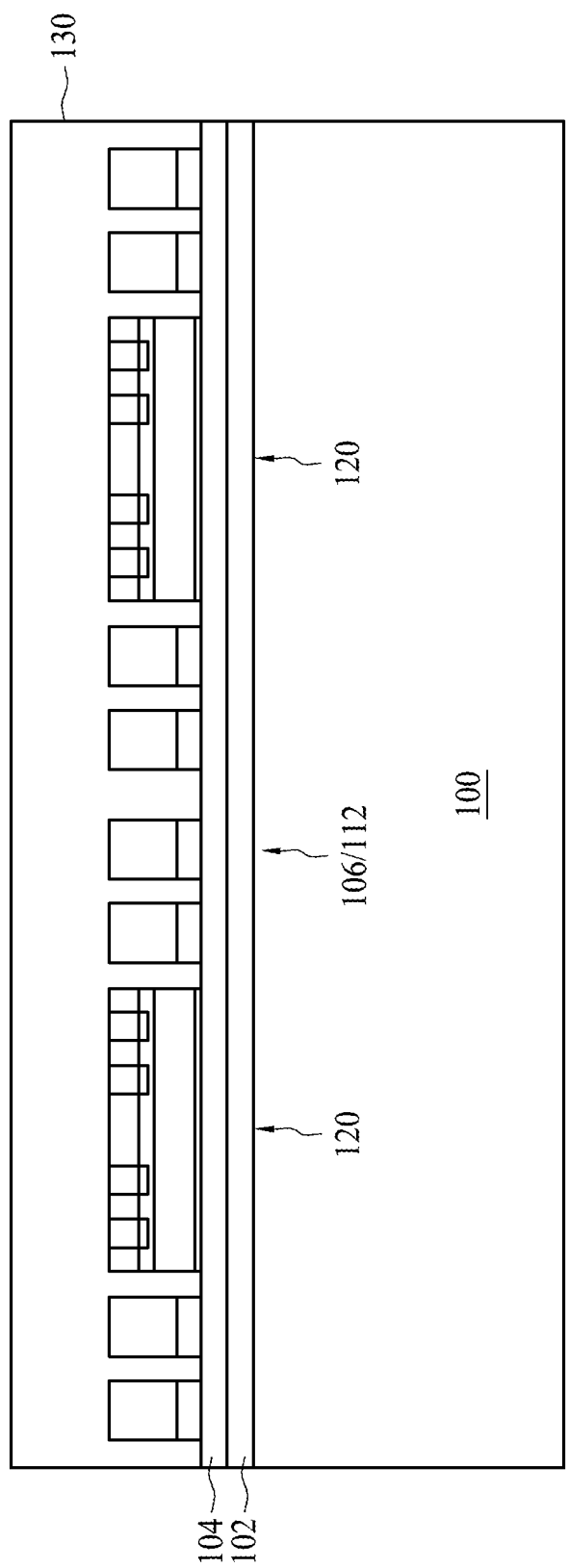

A molding material 130 is then disposed over and around the integrated circuit dies 120 and the through-vias 106/112, as shown in FIG. 9. The molding material 130 is applied using a wafer level molding process in some embodiments, for example. The molding material 130 is formed over exposed portions of the insulating material 104, over the sidewalls of the integrated circuit dies 120, over exposed portions of the second sides 128b of the integrated circuit dies 120, and over the sidewalls and top surfaces of the through-vias 106/112. The molding material 130 is formed around the plurality of through-vias 106/112, around the plurality of dies 120, and between the plurality of through-vias 106/112 and the plurality of dies 120, for example. A first side of the molding material 130 is coupled to the insulating material 104 in some embodiments.

The molding material 130 may be molded using, for example, compressive molding, transfer molding, or other methods. The molding material 130 encapsulates the integrated circuit dies 120 and the through-vias 106/112, for example. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating and/or encapsulating materials.

Next, the molding material 130 is cured using a curing process in some embodiments. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 130 may be cured using other methods. In some embodiments, a curing process is not included.

Figure 10:
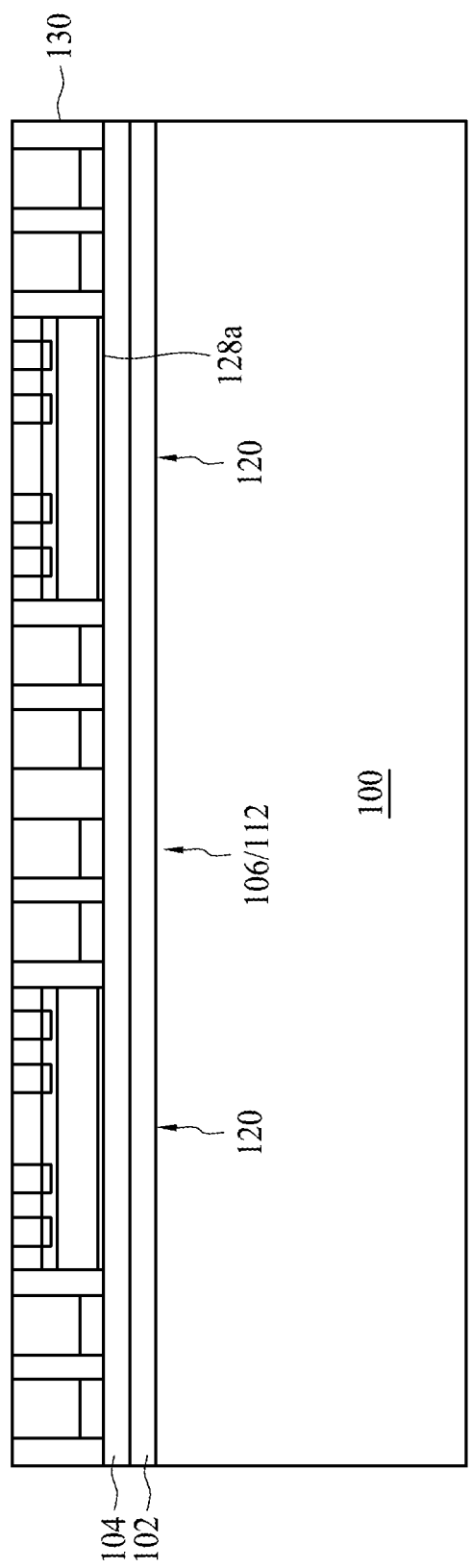

A top portion of the molding material 130 is then removed, as shown in FIG. 10. The top portion of the molding material 130 is removed using a grinding process in some embodiments, for example. The grinding process may comprise a process similar to a sanding process that is used for wood, using a rotating sander, for example. The grinding process may comprise rotating a disk lined with an appropriate material or materials for grinding the materials of the molding material 130 to a predetermined height, for example. The disk may be lined with diamond, for example. In some embodiments, a chemical-mechanical polishing (CMP) process is used to remove the top portion of the molding material 130, for example. A combination of a grinding process and a CMP process may also be used. The CMP process or grinding process may be adapted to stop when the second sides 128b of the integrated circuit dies 120 and/or the top surfaces of the through-vias 106/112 are reached in some embodiments, for example. The CMP process and/or grinding process comprises a front-side grinding process in some embodiments.

In some embodiments, a grinding or CMP process is not required. The molding material 130 may be applied so that the molding material 130 reaches a level that is substantially the same as the level of the second sides 128b of the integrated circuit dies 120 and top surfaces of the through-vias 106/112 in some embodiments, for example. In some embodiments, the molding material 130 top surface may reside below the second sides 128b of the integrated circuit dies 120 and the top surfaces of the through-vias 106/112 after the application of the molding material 130, as another example, not shown.

Figure 11:
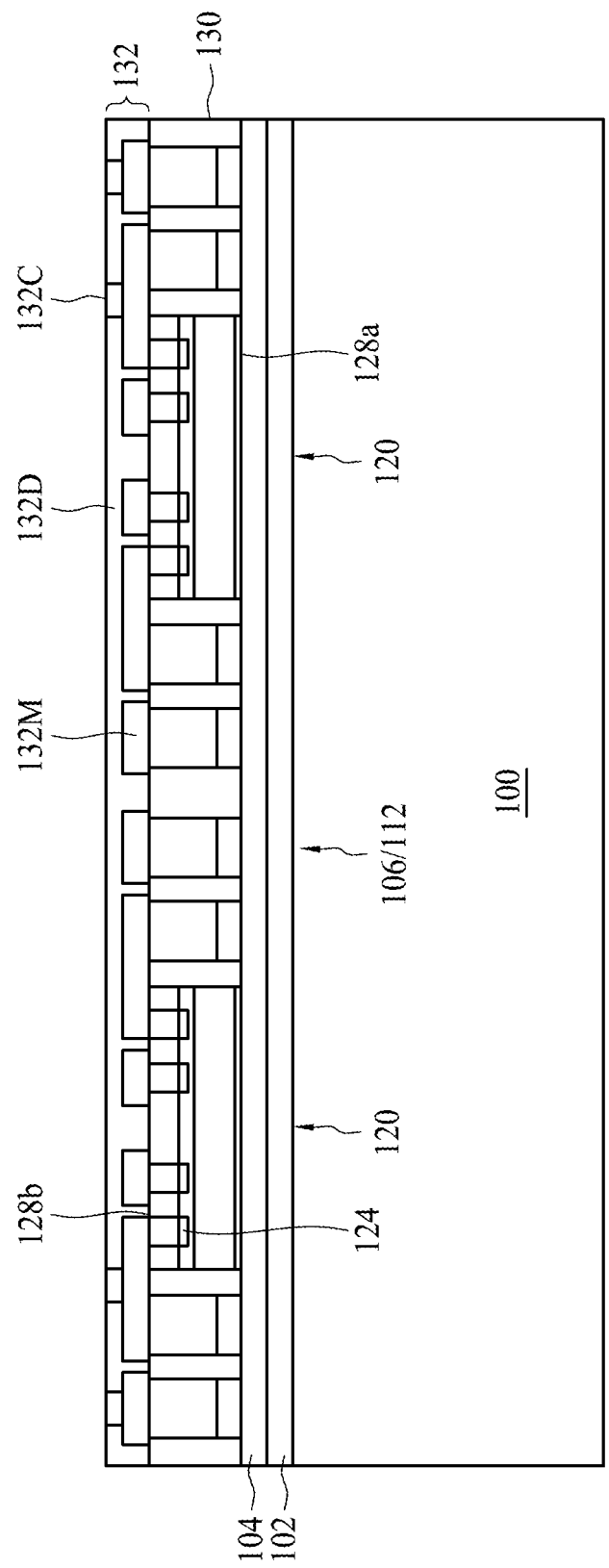

In some embodiments, the top surface of the molding material 130 after the grinding and/or CMP process, or after the molding material 130 deposition process, is substantially coplanar with the second sides 128b of the integrated circuit dies 120 and the top surfaces of the through-vias 106/112. The molding material 130 being substantially coplanar with the second sides 128b and the top surfaces of the through-vias 106/112 advantageously facilitates in the formation of a subsequently formed interconnect structure 132, which is illustrated in FIG. 11. The top surfaces of the molding material 130, integrated circuit dies 120, and the through-vias 106/112 comprise a substantially planar surface for the formation of the interconnect structure 132 in some embodiments, for example.

The interconnect structure 132 is formed over a second side of the plurality of through-vias 106/112, the second side being opposite the first side of the plurality of through-vias 106/112 that is coupled to the insulating material 104. Likewise, the interconnect structure 132 is formed over a second side of the molding material 130, the second side being opposite the first side of the molding material 130 that is coupled to the insulating material 104. Similarly, the interconnect structure 132 is formed over a second side 128b of the integrated circuit dies 120, the second side 128b being opposite the first side 128a of the integrated circuit dies 120.

The interconnect structure 132 comprises a post-passivation interconnect (PPI) structure or a redistribution layer (RDL) in some embodiments that is formed over the plurality of integrated circuit dies 120, the molding material 130, and the top surfaces of the through-vias 106/112, for example. The interconnect structure 132 includes fan-out regions that expand a footprint of contact pads 124 on the integrated circuit dies 120 to a larger footprint for the package in some embodiments, for example. The interconnect structure 132 includes a plurality of dielectric layers 132D, and a plurality of conductive metal lines 132M and/or a plurality of conductive metal vias (not shown) formed inside the plurality of dielectric layers 132D. The plurality of conductive lines 132M and the plurality of conductive vias provide electrical connections to contact pads 124 on the substrate 122 of the integrated circuit dies 120. Two wiring levels are shown in FIGS. 11 through 16; alternatively, one wiring level or three or more wiring levels may be included in the interconnect structure 132.

The dielectric layers 132D may be formed, for example, of a low dielectric constant (low-K) dielectric material, such as phosphosilicate glass (PSG), borophosphosilicate glass (BPSG), fluorinated silicate glass (FSG), SiOxCy, spin-on-glass, spin-on-polymers, silicon carbon material, compounds thereof, composites thereof, combinations thereof, or the like, by any suitable method, such as spinning, CVD, and/or plasma-enhanced CVD (PECVD). The conductive lines 132M and conductive vias may comprise copper, copper alloys, other metals or alloys, or combinations or multiple layers thereof, as examples. The conductive lines 132M and conductive vias may be formed using subtractive and/or damascene techniques, as examples. The conductive lines 132M and conductive vias may be formed using one or more sputtering processes, photolithography processes, plating processes, and photoresist strip processes, as examples. Other methods can also be used to form the interconnect structure 132. The interconnect structure 132 includes contact pads 132C formed proximate a top surface. The contact pads 132C may comprise under-ball metallization (UBM) structures in some embodiments that are arranged in a ball grid array (BGA) or other patterns or arrangements.

Figure 12:
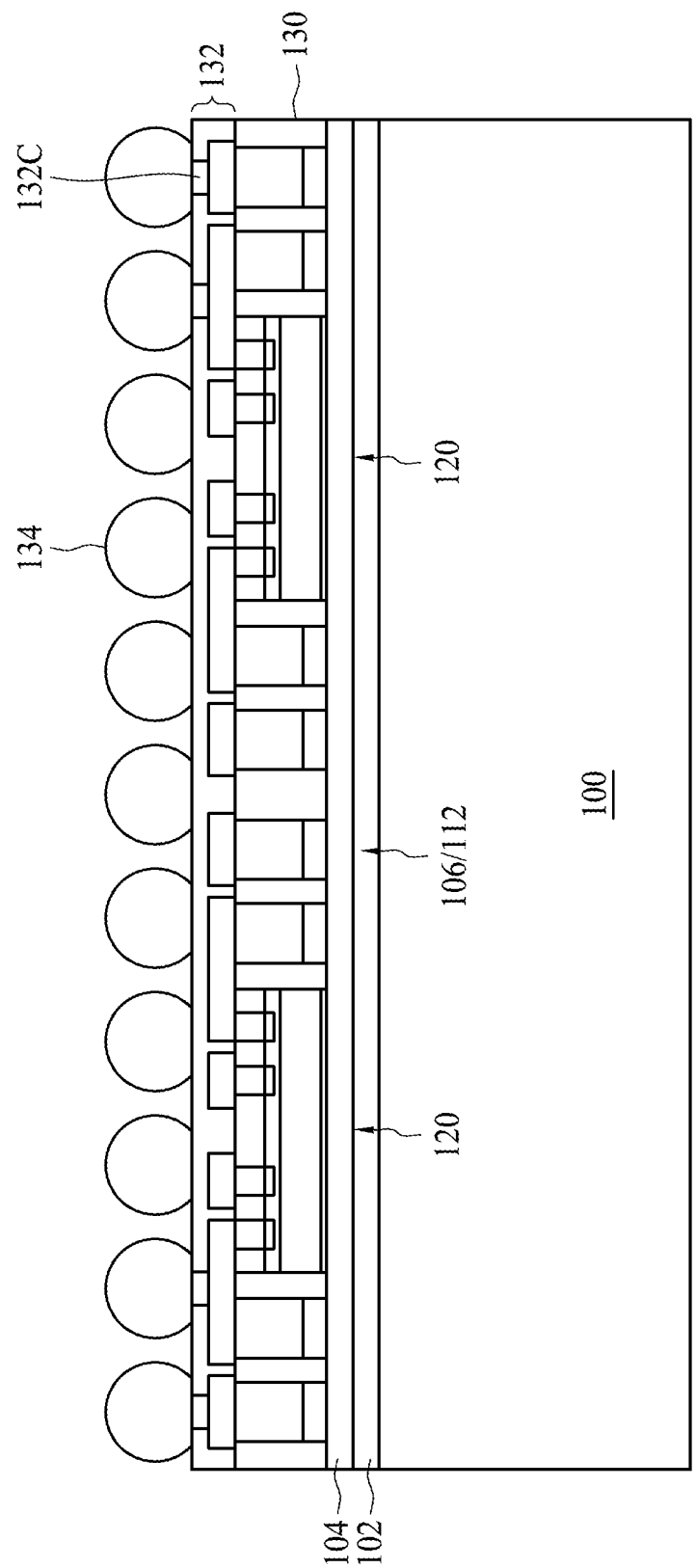

In some embodiments, a plurality of connectors 134 are then coupled to the contact pads 132C of the interconnect structure 132, as shown in FIG. 12. The connectors 134 may comprise a eutectic material such as solder, for example. The eutectic material may comprise solder balls or solder paste in some embodiments that is reflowed by heating the eutectic material to a melting temperature of the eutectic material. The connectors 134 are attached using a ball mount process or other process. The eutectic material is then allowed to cool and re-solidify, forming the connectors 134. The connectors 134 may include other types of electrical connectors, such as microbumps, controlled collapse chip connection (C4) bumps, or pillars, and may include conductive materials such as Cu, Sn, Ag, Pb, or the like. In some embodiments, the connectors 134 are not included on the package. A test of the connectors 134 is then conducted in some embodiments, to ensure electrical and structural integrity of the connections made.

In some embodiments, an insulating material is formed between the connectors 134 over the interconnect structure 132, not shown. The insulating material comprises a LMC in some embodiments. The insulating material may alternatively comprise other materials. In other embodiments, the insulating material is not included.

Figure 13:
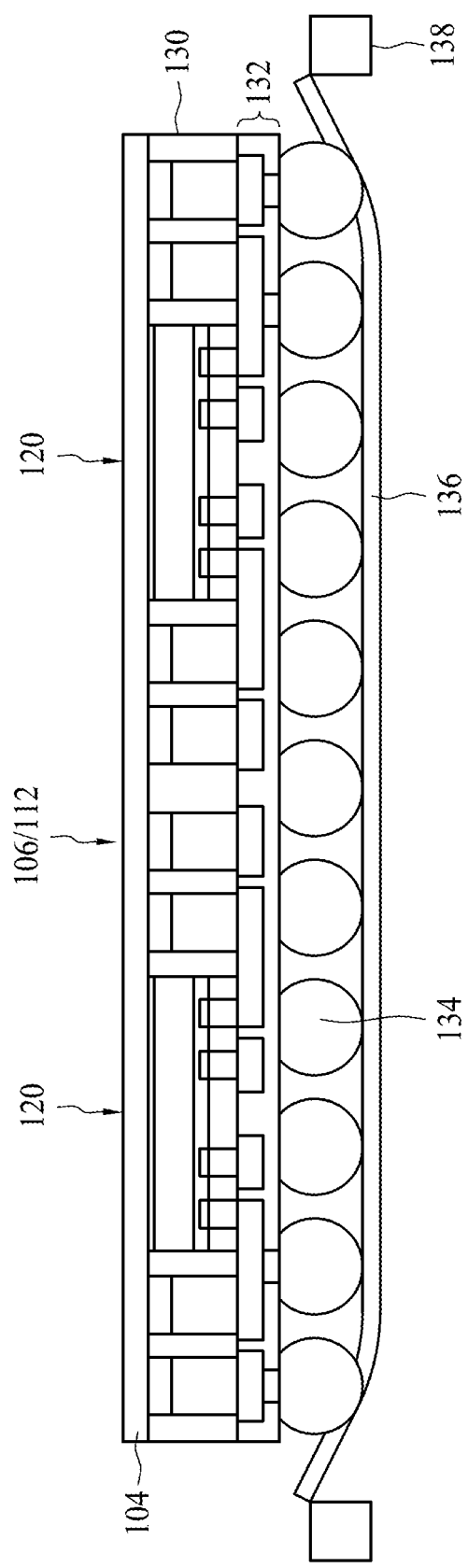

The carrier 100 and structures formed thereon described herein are then inverted, and the connectors 134 are coupled to a dicing tape 136, as shown in FIG. 13. The dicing tape 136 is coupled to a support 138. The carrier 100 and film 102 are then removed, also shown in FIG. 13, using a de-bonding process.

Figure 14:
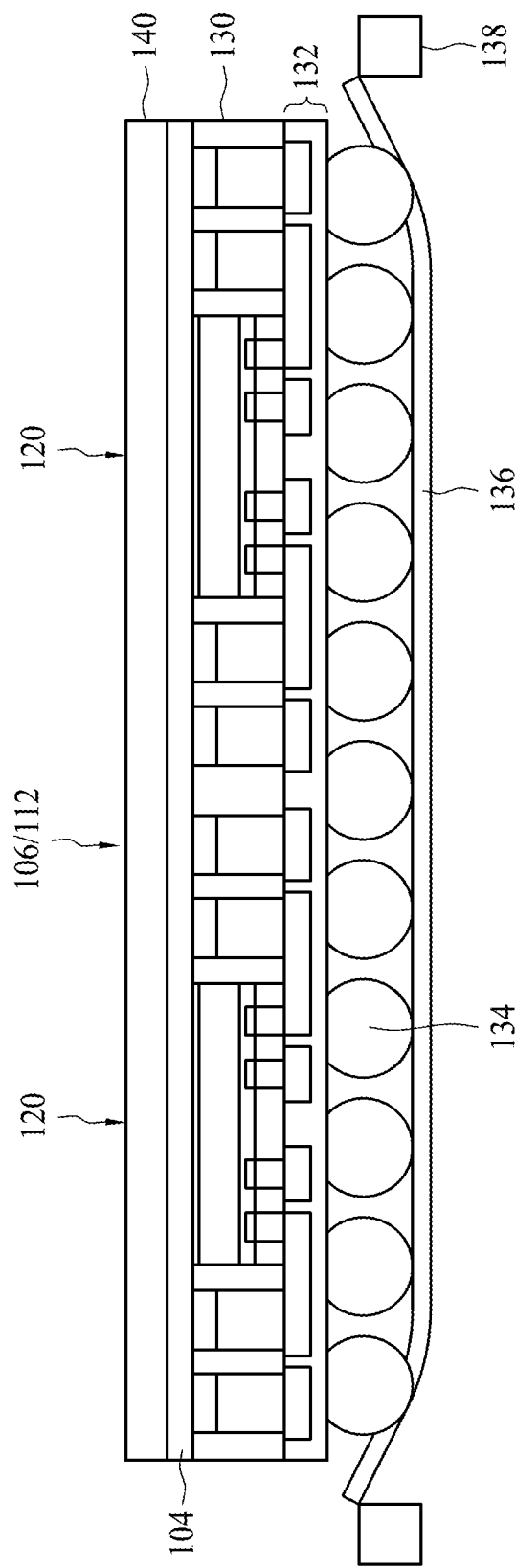

In some embodiments, a protective film 140 is formed over the insulating material 104, as shown in FIG. 14. The protective film 140 is formed after the carrier 100 is removed in some embodiments, for example. The protective film 140 comprises a back side lamination film in some embodiments, for example. The protective film 140 comprises about 1 μm to about 100 μm of a lamination coating (LC) tape or DAF, as examples. The protective film 140 is formed using a laminating process in some embodiments. The protective film 140 may also comprise other materials, dimensions, and formation methods. In some embodiments, the lamination film 140 is not included.

Figure 15:
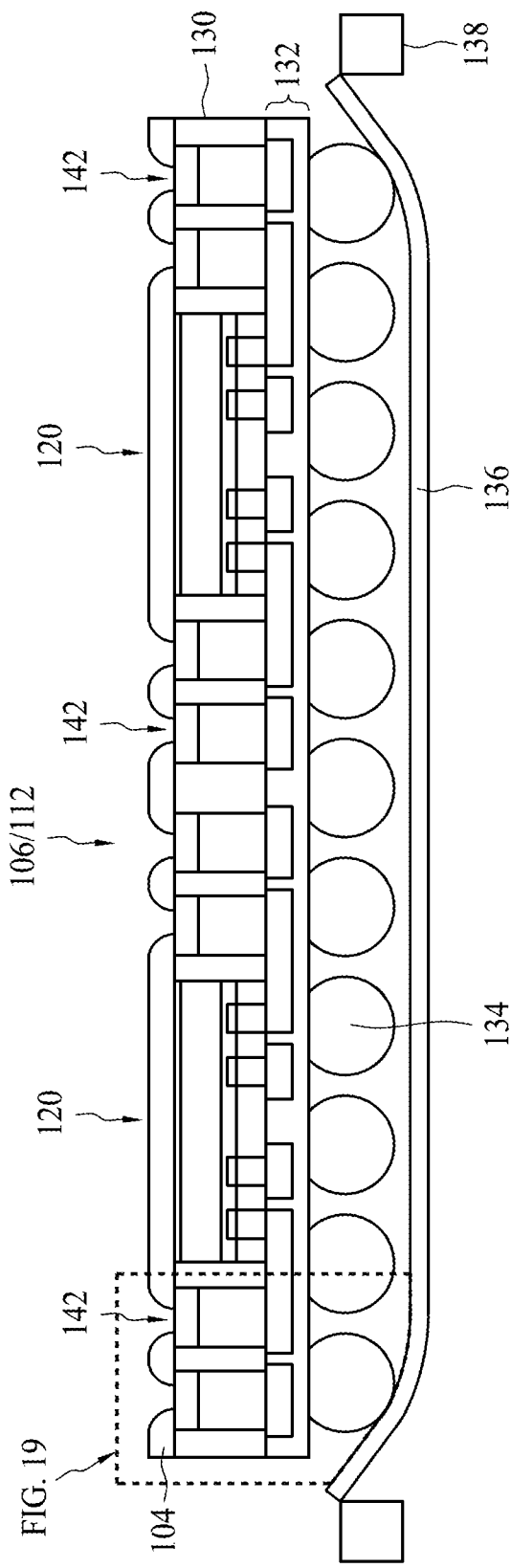
Figure 23:
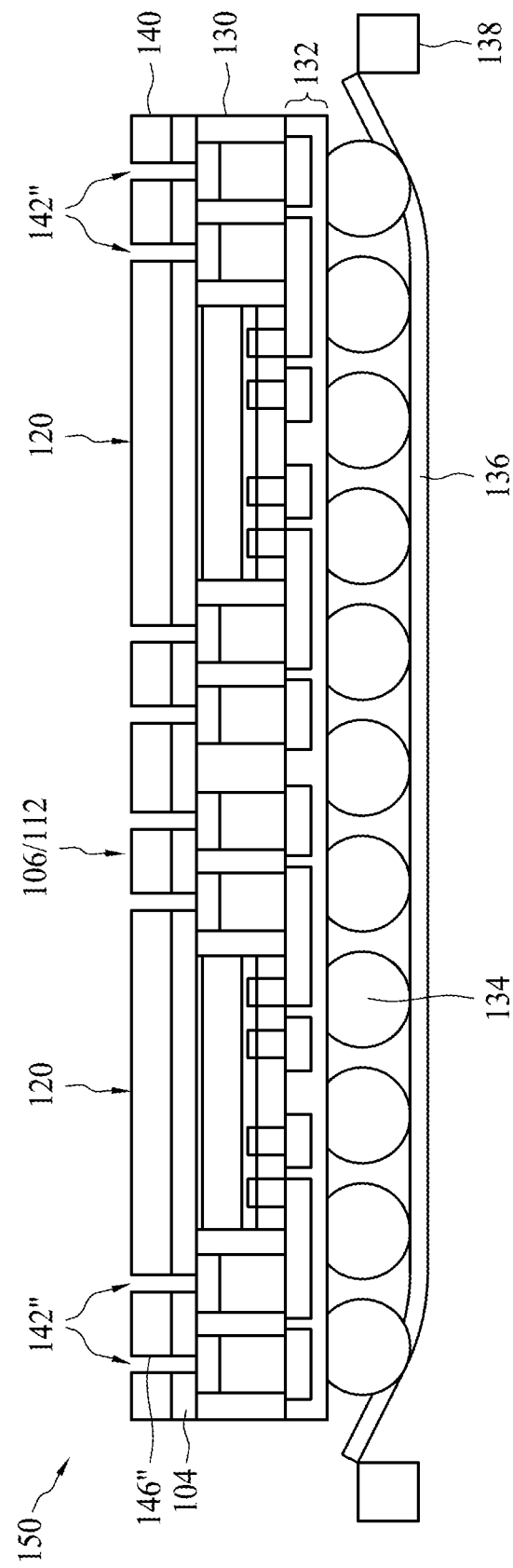
FIG. 23 is a cross-sectional view illustrating a packaged semiconductor device in accordance with some embodiments.

The insulating material 104 is then patterned, as shown in FIG. 15. In embodiments wherein the lamination film 140 is included, the lamination film 140 is also patterned, as shown in FIG. 23, to be described further herein.

Referring next to FIG. 15, in accordance with some embodiments of the present disclosure, a portion of the insulating material 104 proximate each of the plurality of through-vias 106/112 is then removed. The portion of the insulating material 104 that is removed comprises openings 142, wherein an opening 142 is formed over each of the through-vias 106/112. The portions of the insulating material 104 comprise a width that is less than a width of the through-vias 106/112 in some embodiments. For example, the openings 142 in the insulating material 104 comprise a width that is less than a width of the through-vias 106/112 in some embodiments.

Figure 19:
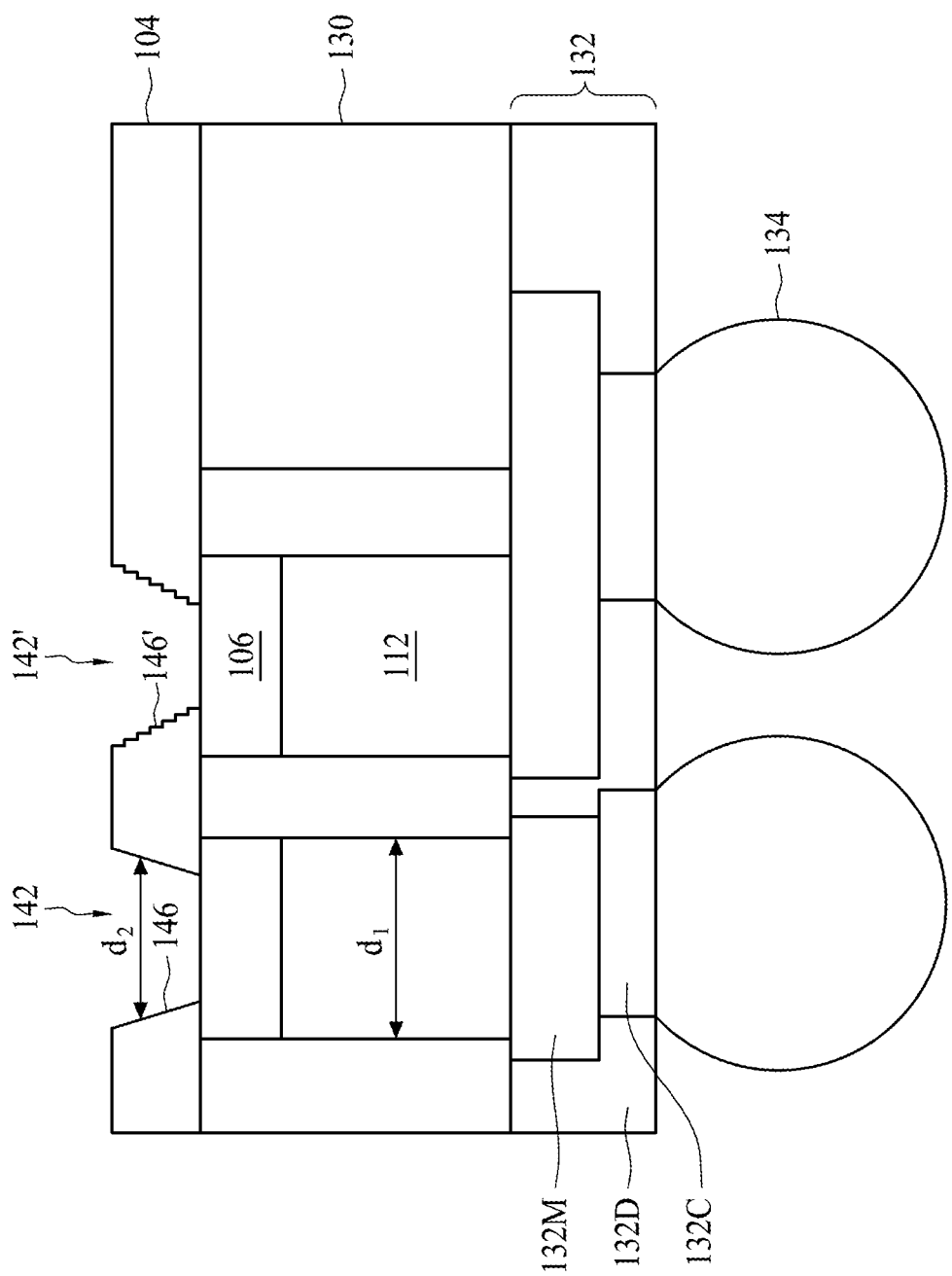
FIG. 19 is a cross-sectional view of a more detailed portion of the packaged semiconductor device shown in FIG. 15 in accordance with some embodiments.

The portions of the insulating material 104 are removed using a laser in some embodiments. Alternatively, the portions of the insulating material 104 may be removed using other methods, such as photolithography. The openings 142 in the insulating material 104 may be formed using a lithography process or a direct patterning method, as examples. Alternatively, other methods may be used to remove the portions of the insulating material 104 proximate the plurality of through-vias 106/112. A portion of each of the through-vias 106/112 is left exposed through the openings 142 in the insulating material 104. Other portions of each of the through-vias 106/112 (e.g., edge portions) remain covered by the insulating material 104. The portions of the through-vias 106/112 that remain covered by the insulating material 104 are also referred to herein as first portions, and the portions of the through-vias 106/112 that are exposed through the openings 142 in the insulating material 104 are also referred to herein as second portions, e.g., in the some of the claims. A more detailed view of two through-vias 106/112 is shown in FIG. 19, which will be described further herein.

Figure 16:
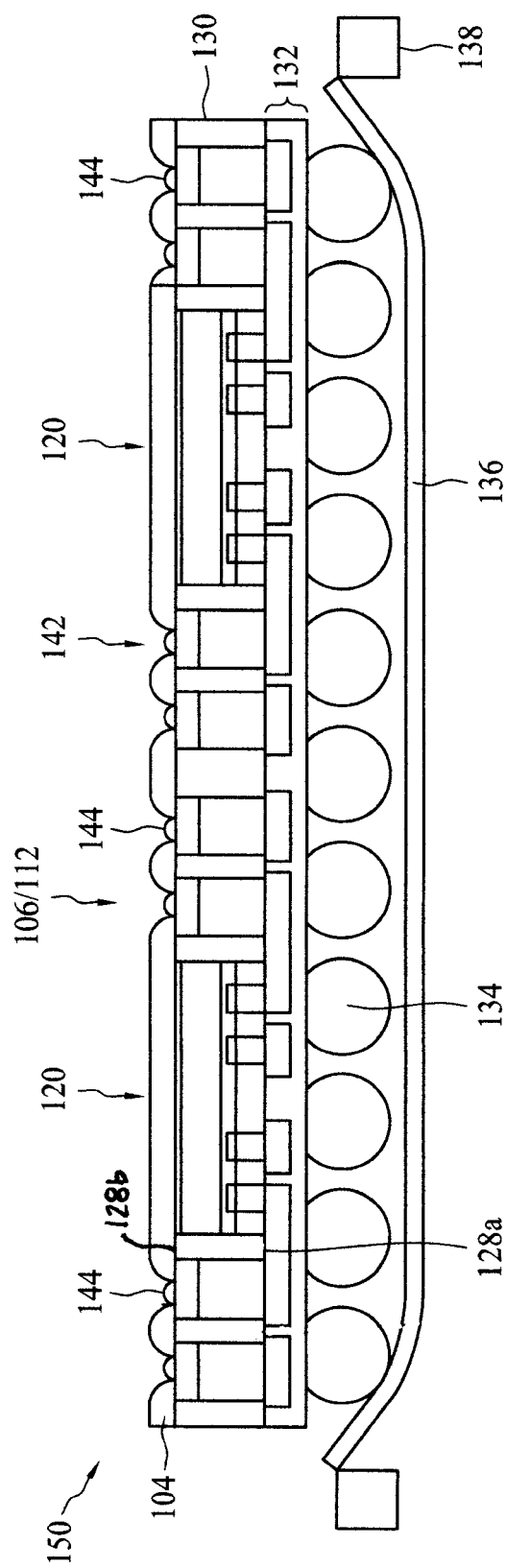

In some embodiments, a solder paste 144 is then formed on the exposed portions of the through-vias 106/112, as shown in FIG. 16. The solder paste 144 facilitates in coupling the packaged semiconductor device 150 to another device, such as another packaged semiconductor device, using connectors (see connectors 158 in FIG. 17). The packaged semiconductor devices 150 are singulated or diced on scribe line regions to form a plurality of packaged semiconductor devices 150 in some embodiments. For example, the molding material 130, the interconnect structure 132, and the insulating material 104 are diced along the scribe lines to form a plurality of the packaged semiconductor devices 150 in some embodiments, for example. In other embodiments, the packaged semiconductor devices 150 are singulated later, after attaching them to other packaged semiconductor devices 160, as shown in FIG. 17.

Two integrated circuit dies 120 are shown being packaged together in the embodiments shown in FIGS. 1 through 16, for example. Alternatively, three or more integrated circuit dies 120 can be packaged in a packaged semiconductor device 150. Portions of the interconnect structure 132 may provide horizontal electrical connections for a plurality of the integrated circuit dies 120 that are packaged together. For example, some of the conductive lines 132M and vias may comprise wiring between the two or more of the integrated circuit dies 120. The molding material 130 is disposed around and between the plurality of integrated circuit dies 120. The interconnect structure 132 is disposed over the plurality of integrated circuit dies 120 and the molding material 130. Integrated circuit dies 120 can also be packaged singly within a packaged semiconductor device 150, as shown in FIGS. 17 and 18 in cross-sectional views.

Figure 17:
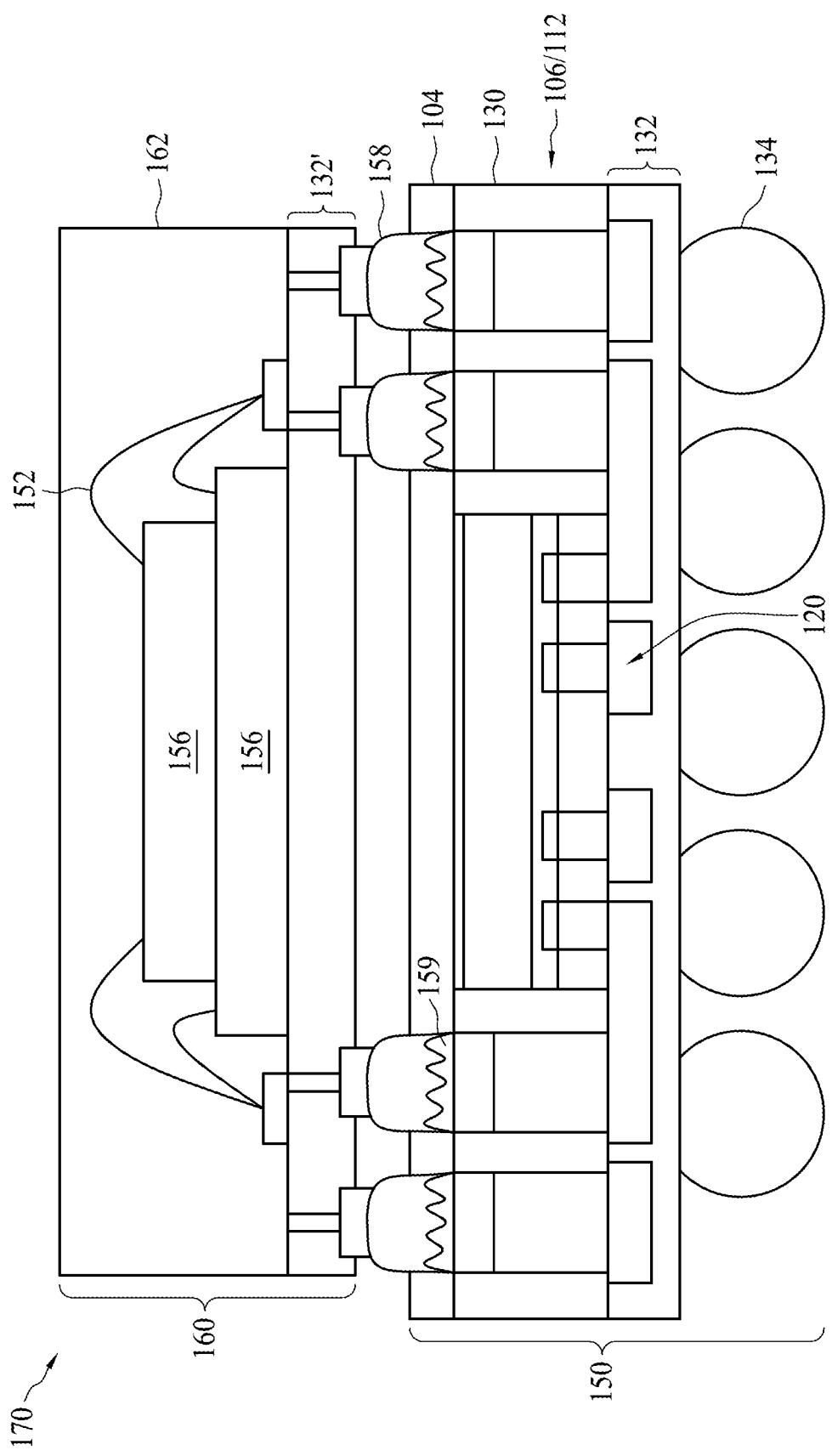
FIGS. 17 and 18 are cross-sectional views of a packaged semiconductor device coupled to another packaged semiconductor device in accordance with some embodiments.
Figure 18:
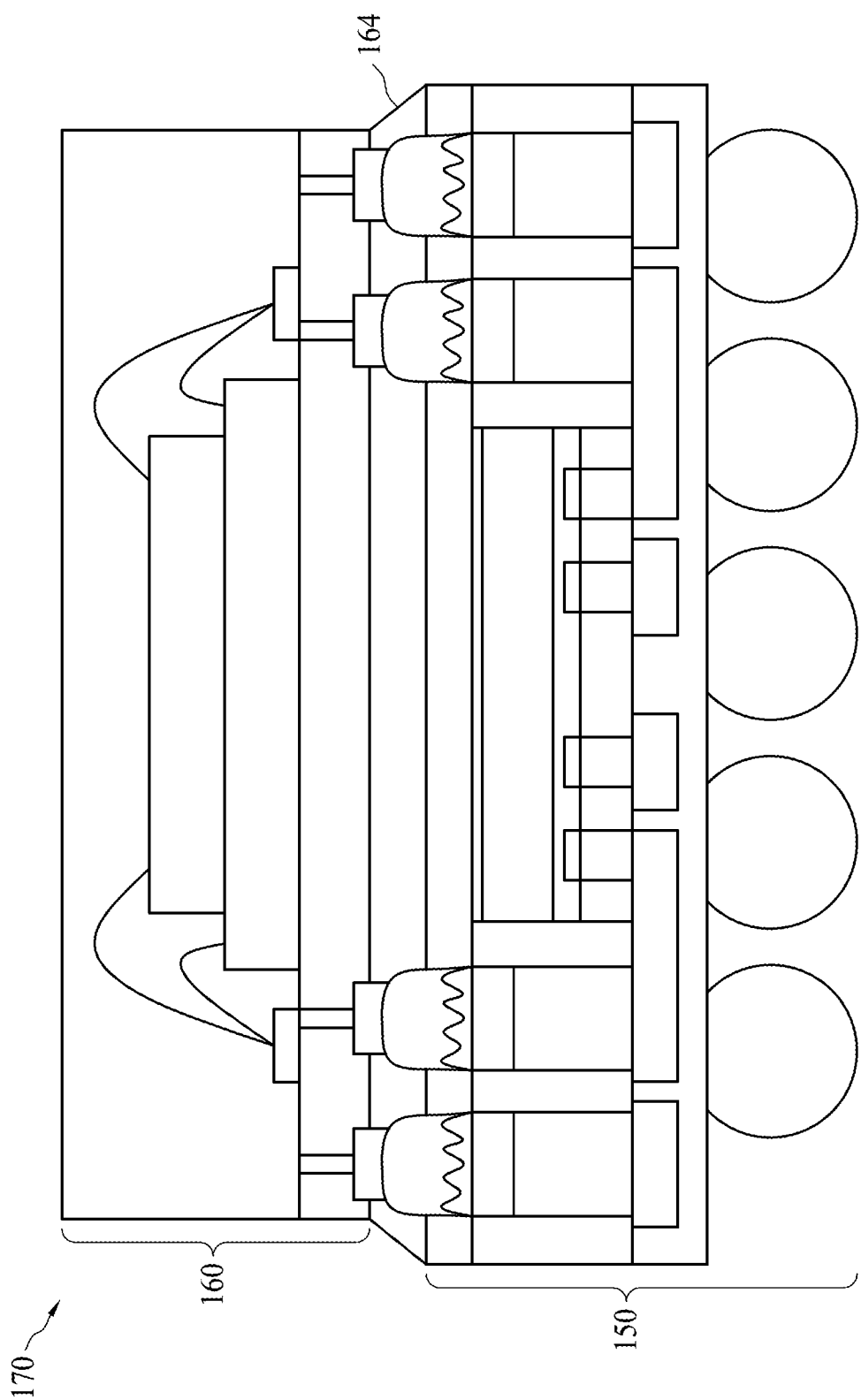

FIGS. 17 and 18 also illustrate a packaged semiconductor device 150 described herein coupled to another packaged semiconductor device 160 in accordance with some embodiments. The packaged semiconductor device 150 comprises a first packaged semiconductor device 150 in some embodiments, and the first packaged semiconductor device 150 is coupled to a second packaged semiconductor device 160 by a plurality of connectors 158. The connectors 158, which may comprise solder balls or other materials, are coupled between through-vias 106/112 of the first packaged semiconductor device 150 and contact pads of the second packaged semiconductor device 160, for example. Each of a plurality of the connectors 158 is coupled to one of the plurality of through-vias 106/112 of the first packaged semiconductor device 150 through the insulating material 104.

An intermetallic compound (IMC) 159 is formed between the connectors 158 and a material of the through-vias 106/112 such as copper and/or the solder paste 144 formed on the through-vias 106/112 (see FIG. 16) in some embodiments, when the connectors 158 are coupled to the through-vias 106/112. In some embodiments, the packaged semiconductor device 170 that includes the first packaged semiconductor device 150 and the second packaged semiconductor device 160 comprises a package-on-package (PoP) device, for example.

The packaged semiconductor device 150 includes a plurality of the through-vias 106/112 formed within the molding material 130. The through-vias 106/112 provide vertical connections for the packaged semiconductor device 150. The interconnect structure 132 provides horizontal electrical connections for the packaged semiconductor device 150. The second packaged semiconductor device 160 also includes an interconnect structure 132' that provides horizontal electrical connections for the packaged semiconductor device 160. Interconnect structure 132' of the second packaged semiconductor device 160 is coupled to the through-vias 106/112 of the first packaged semiconductor device 150 by a plurality of the connectors 158.

The second packaged semiconductor device 160 includes one or more integrated circuit dies 156 coupled to a substrate. In some embodiments, the dies 156 comprise memory chips. For example, the dies 156 may comprise dynamic random access memory (DRAM) devices in some embodiments. Alternatively, the dies 156 may comprise other types of chips. Wire bonds 152 may be coupled to contact pads on a top surface of the integrated circuit die or dies 156, which are coupled to bond pads on the substrate. The wire bonds 152 provide vertical electrical connections for the packaged semiconductor device 160 in some embodiments, for example. A molding material 162 may be disposed over the wire bonds 152, the integrated circuit die or dies 156, and the substrate.

Alternatively, a PoP device 170 may include two packaged semiconductor devices 150 described herein that are coupled together in some embodiments, not shown in the drawings. In some embodiments, the PoP device 170 may comprise a system-on-a-chip (SOC) device, as another example.

In some embodiments, an insulating material 164 is disposed between the packaged semiconductor devices 150 and 160 between the connectors 158, as shown in FIG. 18 in a cross-sectional view. The insulating material 164 may comprise an underfill material or a molding material, as examples. Alternatively, the insulating material 164 may comprise other materials, or the insulating material 164 may not be included.

FIG. 19 is a cross-sectional view of a more detailed portion of FIG. 15 in accordance with some embodiments. Some dimensions and shapes of the openings 142 and 142' in the insulating material 104 in accordance with some embodiments are illustrated. The sidewalls of the openings 142 in the insulating material 104 may comprise a tapered shape 146 in some embodiments. In other embodiments, the sidewalls of the openings 142' in the insulating material 104 may comprise a stair-stepped shape 146'.

The through-vias 106/112 comprise a width comprising dimension $d_1$, wherein dimension $d_1$ comprises about 190 µm to about 210 µm, in some embodiments. Dimension $d_1$ comprises about 300 µm or less in some embodiments, for example. Alternatively, dimension $d_1$ may comprise other values, such as greater than about 300 µm. The openings 142 and 142' comprise a width comprising dimension $d_2$, wherein dimension $d_2$ is less than dimension $d_1$, in some embodiments. Dimension $d_2$ comprises about 10% less or greater than dimension $d_1$ in some embodiments, for example. In other embodiments, dimension $d_2$ comprises about 10% to 30% less than dimension $d_1$, as another example. Dimension $d_2$ comprises about 10 µm to about 350 µm, in some embodiments. Alternatively, dimension $d_2$ may comprise other values and other relative values.

Figure 20:
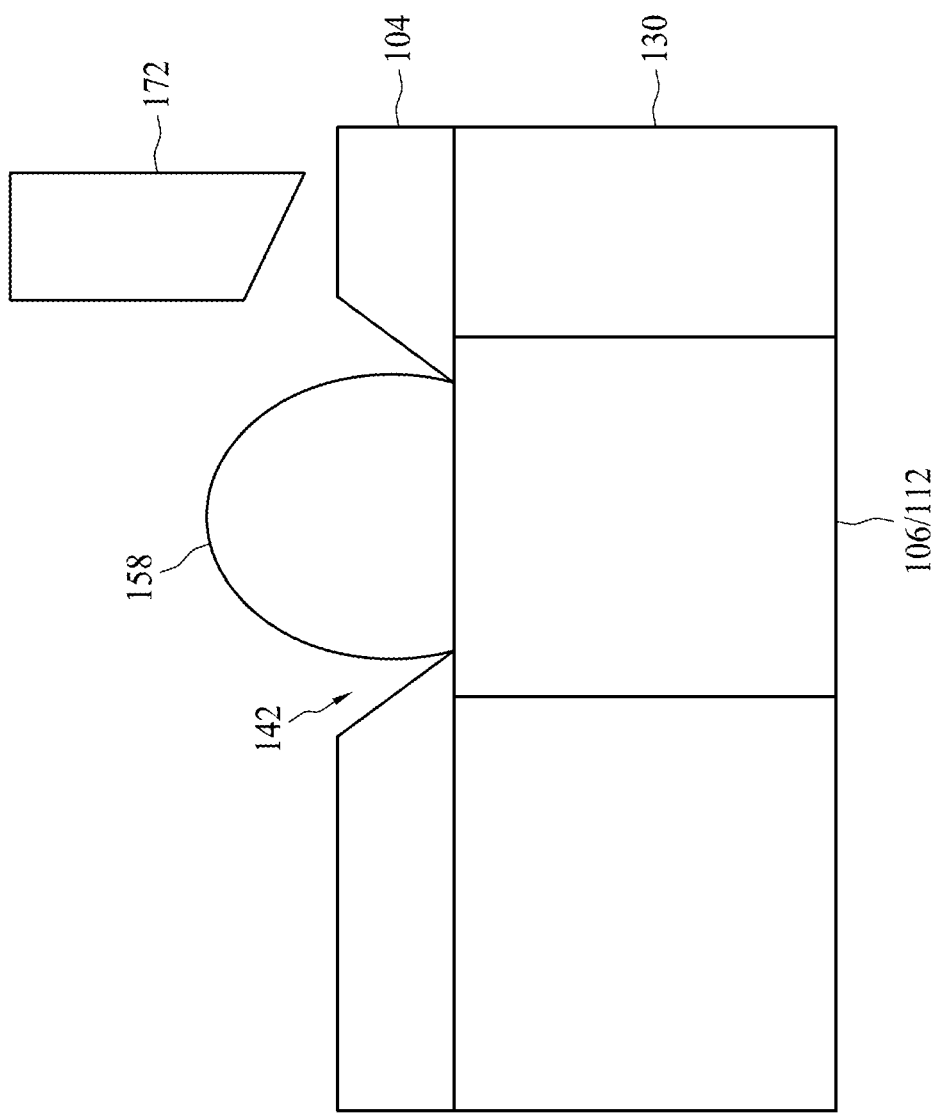
FIG. 20 is a cross-sectional view illustrating a shear force test of a solder ball in accordance with some embodiments.

FIG. 20 is a cross-sectional view illustrating a shear force test of a connector 158 comprising solder ball coupled to a through-via 106/112 of a package in accordance with some embodiments. The connector 158 is coupled to the through-via 106/112 of a packaged semiconductor device 150 described herein through an opening 142 in the insulating material 104. A tool 172 is used to test the shear force of the connector 158 coupled to the through-via 106/112 by exerting lateral pressure on the connector 158. Experimental results of embodiments of the present disclosure showed increased ball strength and a greater shear stress required for a failure of the solder joint. Because a portion of the insulating material 104 resides on a top surface over edges of the through-vias 106/112, a recess proximate the molding material 130 is prevented from forming, which results in an increased strength of the connection of the connector 158 to the through-via 106/112, advantageously.

Figure 21:
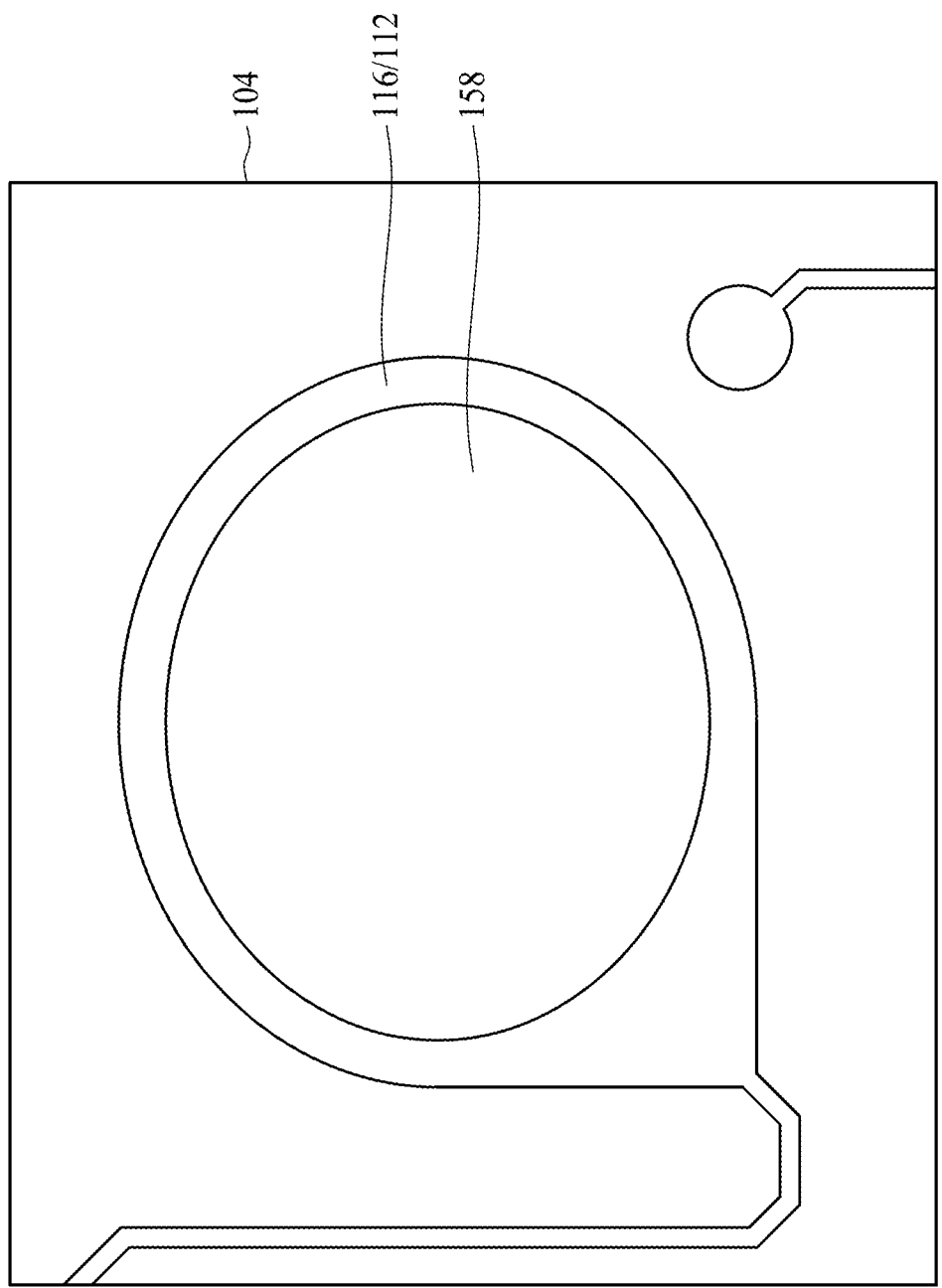
FIGS. 21 and 22 are top views and cross-sectional views, respectively, of portions of a packaged semiconductor device in accordance with some embodiments.
Figure 22:
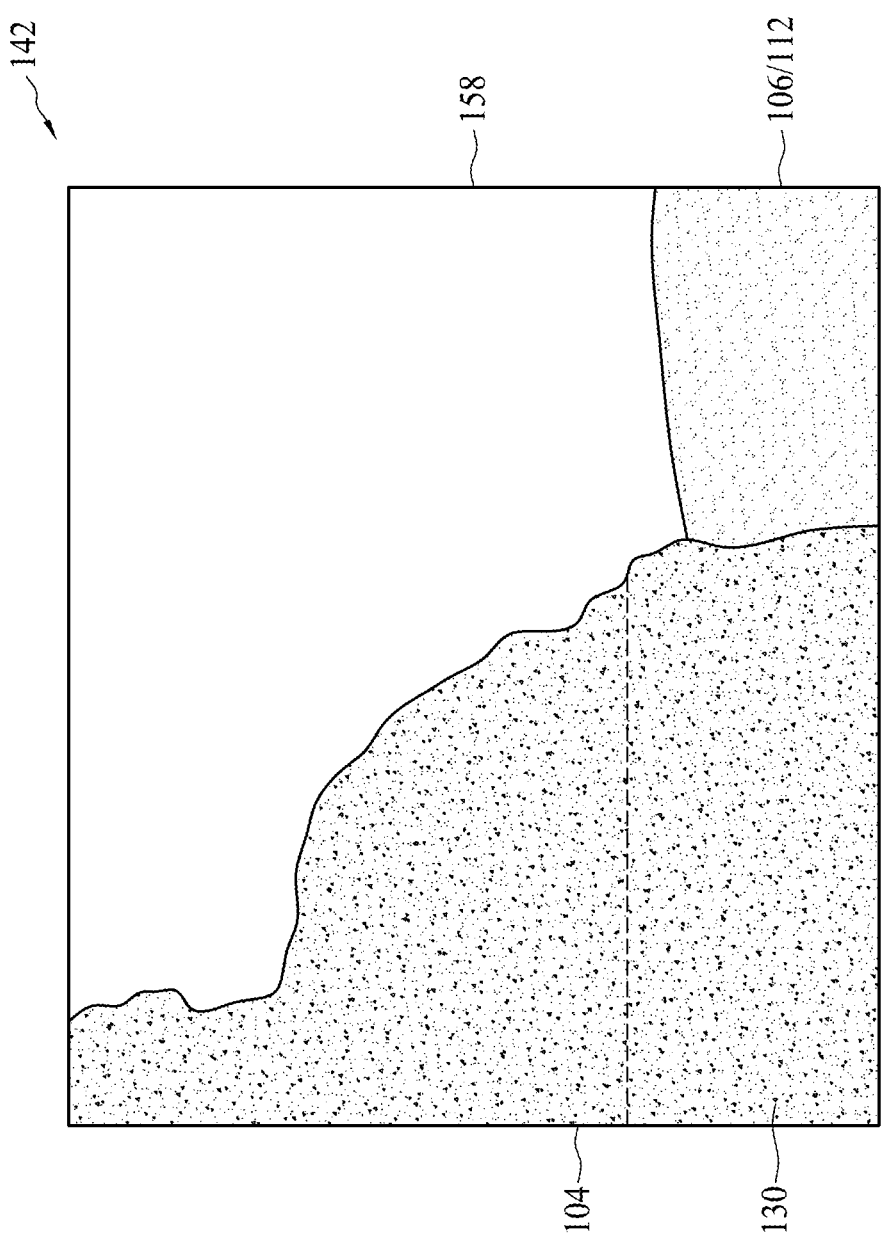

FIGS. 21 and 22 are top views and cross-sectional views, respectively, of portions of a packaged semiconductor device 150 in accordance with some embodiments. FIG. 21 is an image of a connector 158 coupled to a through-via 106/112 in accordance with some embodiments. No recess is formed between the through-via 130 and the molding material 130; rather, the edges of the insulating material 104 are directly adjacent the through-vias 106/112. No portion of the molding material 130 is visible in the top view.

FIG. 22 is a drawing reproduction of a cross-sectional scanning electron microscope (XSEM) image of a region of a packaged semiconductor device 150 proximate an opening 142 in the insulating material 104, which shows a well-sealed area proximate the through-via 106/112, the connector 158, the molding material 130, and the insulating material 104. The connector 158 is well-attached to the insulating material 104. A recess is not formed between the through-via 106/112 and the molding compound 130, advantageously.

FIG. 23 is a cross-sectional view illustrating a packaged semiconductor device 150 in accordance with some embodiments. The protective film 140 is included in the package, disposed over the insulating material 104. The openings 142" are formed in the insulating material 104 and also the protective film 140. Removing the portion of the insulating material 104 proximate each of the plurality of through-vias 106/112 further comprises removing a portion of the protective film 140 proximate each of the plurality of through-vias 106/112 in some embodiments, for example.

FIG. 23 also illustrates some embodiments wherein the openings 142" in the insulating material 104 (and also in the protective film 140) comprise substantially straight sidewalls 146". The sidewalls 146, 146', and 146" of the openings 142, 142', and 142" in the insulating material 104 comprise a shape such as tapered (shown in FIG. 19 at 146), substantially straight (FIG. 23 at 146"), stair-stepped (FIG. 19 at 146'), and/or a combination thereof in some embodiments of the present disclosure, for example. The sidewalls 146, 146', and 146" of the openings 142, 142', and 142" in the insulating material 104 may alternatively comprise other shapes.

Figure 24:
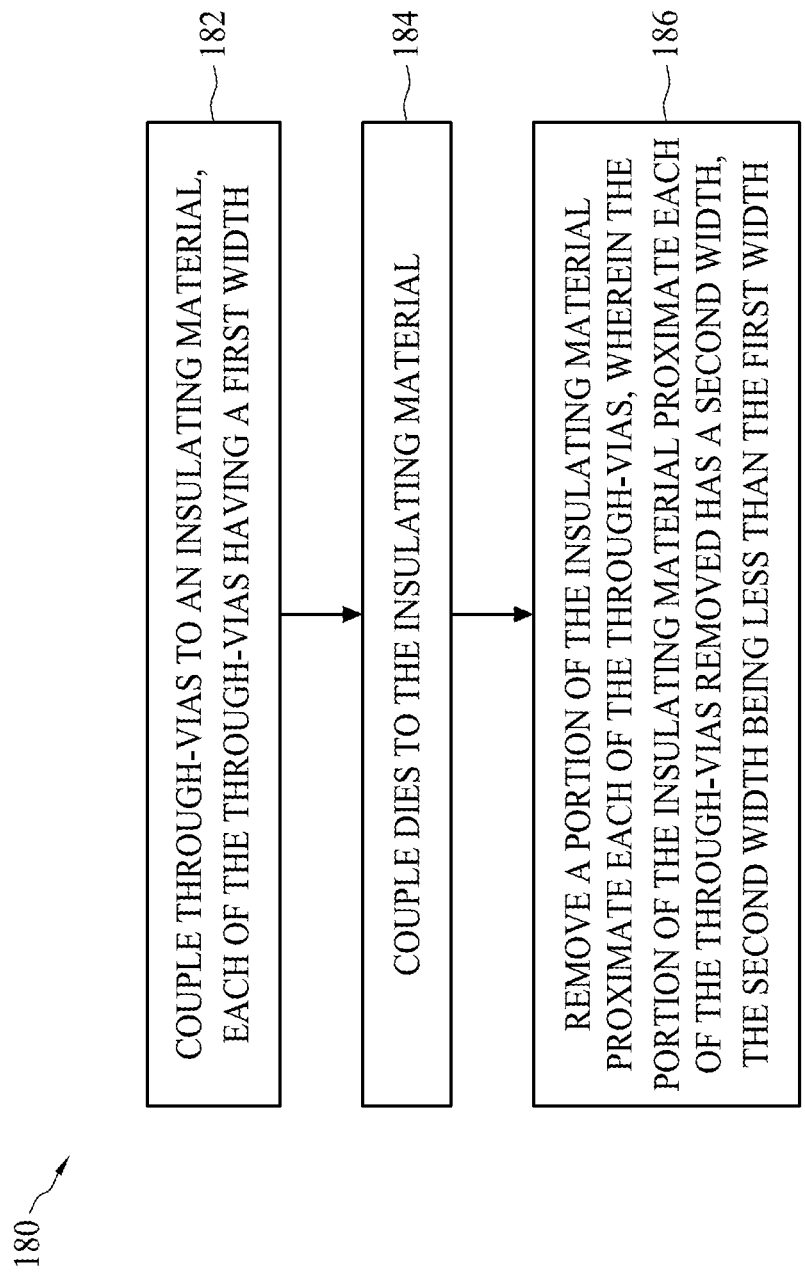
FIG. 24 is a flow chart illustrating a method of packaging a semiconductor device in accordance with some embodiments.

FIG. 24 is a flow chart 180 illustrating a method of packaging a semiconductor device in accordance with some embodiments. In step 182, through-vias 106/112 (see also FIGS. 1 through 7) are coupled to an insulating material 104, each of the through-vias 106/112 having a first width $d_1$ (FIG. 19). In step 184, dies 120 are coupled to the insulating material 104 (FIG. 8). In step 186, a portion of the insulating material 104 proximate each of the through-vias 106/112 is removed, wherein the portion of the insulating material 104 proximate each of the through-vias 106/112 removed has a second width $d_2$, the second width $d_2$ being less than the first width $d_1$ (FIGS. 15 and 19).

Some embodiments of the present disclosure include methods of packaging semiconductor devices. Other embodiments include packaged semiconductor devices 150 and/or 170 that have been packaged using the novel methods described herein.

Some advantages of embodiments of the present disclosure include providing packaging methods and structures wherein openings in an insulating material over through-vias have a smaller width than the through-vias. The openings in the insulating material having a smaller width than the through-vias prevents a recess from forming between a molding material and the through-vias, which improves reliability and eliminates water vapor from entering into such a recess. A gap between connectors comprising solder balls, the insulating material, and the molding material is prevented from forming. Because the recess is not formed between the molding material and the through-vias, controlling the depth of the recess is not an issue.

Furthermore, uniformity of solder paste that is applied to the top surfaces of the through-vias is improved, due to the prevention of the recess forming between the molding material and the through-vias. The solder paste is only formed on top surfaces of the through-vias. The solder paste is not formed on sidewalls of the through-vias, which are covered by the molding material, for example. Overlay (OVL) performance is also improved.

The novel packaging structures and methods are implementable in and are particularly beneficial for wafer level packaging (WLP) or chip scale packaging (CSP) techniques and processes. Furthermore, the novel packaging methods and structures described herein are easily implementable in manufacturing and packaging process flows.

In some embodiments, a method of packaging a semiconductor device includes coupling a plurality of through-vias to an insulating material, each of the plurality of through-vias comprising a first width, and coupling a plurality of dies to the insulating material. The method includes removing a portion of the insulating material proximate each of the plurality of through-vias, wherein the portion of the insulating material proximate each of the plurality of through-vias removed comprises a second width, the second width being less than the first width.

In other embodiments, a method of packaging a semiconductor device includes forming an insulating material over a carrier, and coupling a plurality of through-vias to the insulating material. Each of the plurality of through-vias comprises a first width. The method includes coupling a plurality of dies to the insulating material, and disposing a molding material around the plurality of through-vias, around the plurality of dies, and between the plurality of through-vias and the plurality of dies. An interconnect structure is formed over the plurality of through-vias, the plurality of dies, and the molding material. The carrier is removed, and a portion of the insulating material proximate each of the plurality of through-vias is removed. The portion of the insulating material proximate each of the plurality of through-vias removed comprises a second width, the second width being less than the first width. The insulating material, the molding material, and the interconnect structure are diced to form a plurality of packaged semiconductor devices.

In other embodiments, a packaged semiconductor device includes an integrated circuit die, a molding material disposed around the integrated circuit die, and a plurality of through-vias disposed within the molding material. Each of the plurality of through-vias comprises a first width. An insulating material is disposed on a first side of the integrated circuit die, the molding material, and a first portion of each of the plurality of through-vias. An interconnect structure is disposed on a second side of the integrated circuit die, the molding material, and the plurality of through-vias. A second portion of each of the through-vias is exposed through openings in the insulating material. The openings in the insulating material comprise a second width, the second width being less than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
   forming an insulating layer on a substrate;
   after forming the insulating layer, forming a plurality of through-vias on the insulating layer, each of the plurality of through-vias comprising a first width, the first width measured in a direction parallel to a topmost surface of the insulating layer, and extending from the topmost surface of the insulating layer by a distance greater than the first width;
   coupling a plurality of dies to the insulating layer;
   removing the substrate;
   forming a protective film adjacent the insulating material after removing the substrate;
   removing a portion of the insulating layer proximate each of the plurality of through-vias to expose a portion of each of the plurality of through-vias, each exposed portion having a second width, the second width being less than the first width, the second width measured in the direction parallel to the major plane of the insulating layer, wherein removing the portion of the insulating material further comprises removing a portion of the protective film; and
   forming solder paste over the exposed portion of each of the plurality of the through-vias.

2. The method according to claim 1, further comprising forming a molding material around the plurality of through-vias, around the plurality of dies, and between the plurality of through-vias and the plurality of dies.

3. The method according to claim 2, wherein coupling the plurality of through-vias to the insulating layer and coupling the plurality of dies to the insulating layer comprises coupling a first side of the plurality of through-vias and the plurality of dies, and wherein the method further comprises forming an interconnect structure over a second side of the plurality of through-vias and the plurality of dies, the second side being opposite the first side.

4. The method according to claim 3, further comprising coupling a plurality of connectors to the interconnect structure.

5. The method according to claim 3, wherein forming the interconnect structure comprises forming fan-out regions.

6. The method according to claim 1, wherein each through-via of the plurality of through-vias has a width that is substantially uniform from a topmost edge of the through-via to a bottommost edge of the through-via, each of the plurality of through-vias extending along a major axis that is longer than the first width and substantially perpendicular to the first width.

7. The method according to claim 1, wherein the forming the protective film is performed at least in part with a lamination process.

8. The method according to claim 1, wherein the protective film has a thickness of between about 1 μm and about 100 μm.

9. A method of packaging a semiconductor device, the method comprising:
   forming an insulating material over a carrier, the insulating material having a planar topmost surface;
   after forming the insulating material, forming on and extending outward from the planar topmost surface of the insulating material a plurality of through-vias, each of the plurality of through-vias comprising a first width;
   coupling a plurality of dies to the insulating material;
   disposing a molding material around the plurality of through-vias, around the plurality of dies, and between the plurality of through-vias and the plurality of dies;
   forming an interconnect structure over the plurality of through-vias, the plurality of dies, and the molding material;
   removing the carrier;
   forming a protective film over the insulating material, after removing the carrier;
   removing a portion of the insulating material proximate each of the plurality of through-vias, wherein the portion of the insulating material proximate each of the plurality of through-vias removed comprises a second width, the second width being less than the first width, wherein removing the portion of the insulating material proximate each of the plurality of through-vias further comprises removing a portion of the protective film proximate each of the plurality of through-vias; and
   dicing the insulating material, the molding material, and the interconnect structure to form a plurality of packaged semiconductor devices.

10. The method according to claim 9, wherein coupling the plurality of through-vias to the insulating material comprises a process selected from the group consisting essentially of a plating process, a subtractive etch process, a damascene process, and combinations thereof.

11. The method according to claim 10, wherein coupling the plurality of through-vias to the insulating material comprises a plating process, and wherein the plating process comprises:
   forming a seed layer over the insulating material;
   forming a sacrificial material over the seed layer;
   patterning the sacrificial material;
   plating a conductive material over the seed layer through the patterned sacrificial material;
   removing the sacrificial material, leaving portions of the seed layer exposed between the conductive material; and
   removing the exposed portions of the seed layer.

12. The method according to claim 9, wherein disposing the molding material around the plurality of through-vias and the plurality of dies comprises forming the molding material over the plurality of through-vias and the plurality of dies, and wherein the method further comprises removing a top portion of the molding material from over the plurality of through-vias and the plurality of dies.

13. The method according to claim 12, wherein removing the top portion of the molding material comprises a grinding process or a chemical-mechanical polishing (CMP) process.

14. The method according to claim 9, wherein removing the portion of the insulating material proximate each of the plurality of through-vias comprises a laser process.

15. The method according to claim 9, wherein each through-via of the plurality of through-vias has a width that is substantially uniform from a topmost edge of the through-via to a bottommost edge of the through-via, each of the plurality of through-vias extending along a major axis that is longer than the first width and substantially perpendicular to the first width.

16. The method according to claim 9, wherein the insulating material is formed directly on the carrier with the planar topmost surface facing away from the carrier.

17. A method of manufacturing a packaged semiconductor device, the method comprising:
   providing an integrated circuit die on an insulating material over a substrate;
   dispensing a molding material disposed around the integrated circuit die, wherein after the dispensing the molding material a plurality of through-vias are disposed within the molding material, each of the plurality of through-vias comprising a constant first width of conductive material as each of the plurality of through-vias extend from a first side of the molding material to a second side of the molding material, the first width measured from a first sidewall of the molding material to a second sidewall of the molding material;
   removing the substrate;
   depositing a protective film adjacent the insulating material after the removing the substrate;
   removing a portion of the insulating material proximate each of the plurality of through-vias to expose a portion of each of the plurality of through vias, each exposed portion having a second width, the second width being less than the first width, wherein the removing the portion of the insulating material further comprises removing a portion of the protective film;
   forming an interconnect structure disposed on a second side of the integrated circuit die, the molding material, and the plurality of through-vias, the interconnect structure having a first end in physical contact with a contact pad on the integrated circuit die and a second end in physical contact with at least one through-via of the plurality of through-vias, the second end being electrically continuous with the first end; and
   forming a plurality of connectors coupled to respective ones of the plurality of through-vias through the insulating material, wherein the plurality of connectors each comprises a solder ball and an intermetallic compound.

18. The method of claim 17, wherein the insulating material comprises a material selected from the group consisting essentially of a solder resist (SR), polyimide (PI), polybenzoxazole (PBO), and combinations thereof.

19. The method of claim 17, wherein sidewalls of the openings in the insulating material comprise a shape selected from the group consisting essentially of tapered, substantially straight, stair-stepped, and combinations thereof.

20. The method of claim 17, wherein the forming the interconnect structure comprises forming a post-passivation interconnect (PPI) structure or a redistribution layer (RDL).

21. The method of claim 17, wherein the dispensing the molding material dispenses the molding material around and between a plurality of integrated circuit dies, and wherein the interconnect structure is disposed over the plurality of the integrated circuit dies and the molding material.

22. The method of claim 17, further comprising a packaged semiconductor device electrically coupled to the plurality of connectors.

23. The method of claim 17, wherein each through-via extends along a major axis that is longer than the first width and substantially perpendicular to the first width.

24. The method of claim 17, wherein each of the plurality of through-vias being a solid conductive material extending continuously from the first sidewall of the molding material to the second sidewall of the molding material.

* * * * *